(12) United States Patent
Moriyama et al.

(10) Patent No.: US 12,356,590 B2
(45) Date of Patent: Jul. 8, 2025

(54) COOLING APPARATUS

(71) Applicant: Mitsubishi Electric Corporation, Tokyo (JP)

(72) Inventors: Takashi Moriyama, Tokyo (JP); Hiroaki Ishikawa, Tokyo (JP); Tomohiko Saito, Tokyo (JP); Tatsuya Kusashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 181 days.

(21) Appl. No.: 18/008,685

(22) PCT Filed: Aug. 4, 2020

(86) PCT No.: PCT/JP2020/029826
§ 371 (c)(1),
(2) Date: Dec. 7, 2022

(87) PCT Pub. No.: WO2022/029889
PCT Pub. Date: Feb. 10, 2022

(65) Prior Publication Data
US 2023/0232588 A1 Jul. 20, 2023

(51) Int. Cl.
*B64G 1/58* (2006.01)
*H05K 7/20* (2006.01)

(52) U.S. Cl.
CPC ............ *H05K 7/2039* (2013.01); *B64G 1/58* (2013.01); *H05K 7/20327* (2013.01)

(58) Field of Classification Search
CPC ...... H05K 7/20327; F25B 21/00; F25B 21/02; F25B 21/04; F25B 2321/0252; B64G 1/58; B64G 1/50; B64G 1/503
See application file for complete search history.

(56) References Cited

U.S. PATENT DOCUMENTS

| 4,603,732 A | 8/1986 | Niggemann |
| 4,622,925 A | 11/1986 | Kubozuka |

(Continued)

FOREIGN PATENT DOCUMENTS

| EP | 2631183 A1 | 8/2013 |
| JP | 60-93116 A | 5/1985 |

(Continued)

OTHER PUBLICATIONS

KR-101461057-B1 English Translation (Year: 2014).*

(Continued)

*Primary Examiner* — Frantz F Jules
*Assistant Examiner* — Devon Moore
(74) *Attorney, Agent, or Firm* — XSENSUS LLP

(57) ABSTRACT

A cooling apparatus (100) cools a heat-generating instrument, such as an electronic instrument (2), installed in an installation apparatus. The cooling apparatus (100) includes a refrigerant flow path configured circularly by sequentially connecting a pump (1) that circulates a refrigerant in a liquid state, a cooler (3) that cools the heat-generating instrument with the refrigerant, and a radiator (5) that cools the refrigerant. The cooling apparatus (100) includes a discharge-side heat exchanger (7) provided in a flow path from the pump (1) to the cooler (3) in the refrigerant flow path, a suction-side heat exchanger (8) provided in a flow path from the radiator (5) to the pump (1) in the refrigerant flow path, and a Peltier device (9) that is provided between the discharge-side heat exchanger (7) and the suction-side heat exchanger (8), and transfers heat from the refrigerant flowing through the suction-side heat exchanger (8) to the refrigerant flowing through the discharge-side heat exchanger (7).

10 Claims, 30 Drawing Sheets

(56) References Cited

U.S. PATENT DOCUMENTS

| | | | |
|---|---|---|---|
| 4,632,178 A | 12/1986 | Hirano | |
| 5,794,890 A | 8/1998 | Jones, Jr. | |
| 6,435,274 B1 | 8/2002 | Weislogel | |
| 6,840,304 B1 | 1/2005 | Kobayashi et al. | |
| 6,883,588 B1 | 4/2005 | Low et al. | |
| 6,990,816 B1 | 1/2006 | Zuo et al. | |
| 7,174,950 B2 | 2/2007 | Jacque | |
| 7,475,551 B2 * | 1/2009 | Ghoshal | H10N 10/17 62/3.2 |
| 2004/0232284 A1 | 11/2004 | Tjiptahardja et al. | |
| 2005/0083654 A1 | 4/2005 | Tsoi | |
| 2006/0254308 A1 | 11/2006 | Yokoyama et al. | |
| 2011/0001013 A1 | 1/2011 | Torres Sepulveda et al. | |
| 2012/0116594 A1 | 5/2012 | Aidoun et al. | |
| 2016/0381838 A1 | 12/2016 | Nakanishi et al. | |
| 2017/0127564 A1 | 5/2017 | So et al. | |
| 2017/0160021 A1 | 6/2017 | Cognata et al. | |
| 2018/0031285 A1 * | 2/2018 | Thomas | F25B 21/04 |
| 2020/0018554 A1 | 1/2020 | Ipposhi et al. | |

FOREIGN PATENT DOCUMENTS

| | | | |
|---|---|---|---|
| JP | 61-43213 A | 3/1986 | |
| JP | 5-202750 A | 8/1993 | |
| JP | 7-113565 A | 5/1995 | |
| JP | 7-113567 A | 5/1995 | |
| JP | 7-113568 A | 5/1995 | |
| JP | 7-208883 A | 8/1995 | |
| JP | 8-30412 B2 | 3/1996 | |
| JP | 11-6431 A | 1/1999 | |
| JP | 2000-241089 A | 9/2000 | |
| JP | 2002-48357 A | 2/2002 | |
| JP | 2003-291900 A | 10/2003 | |
| JP | 2004-349551 A | 12/2004 | |
| JP | 2005-517288 A | 6/2005 | |
| JP | 2006-317116 A | 11/2006 | |
| JP | 2010-26134 A | 2/2010 | |
| JP | 2010-96436 A | 4/2010 | |
| JP | 2011-185504 A | 9/2011 | |
| JP | 2012-533046 A | 12/2012 | |
| JP | 2014-167377 A | 9/2014 | |
| JP | 2014-183107 A | 9/2014 | |
| JP | 2015-35335 A | 2/2015 | |
| JP | 2016-223742 A | 12/2016 | |
| JP | 2017-10408 A | 1/2017 | |
| JP | 2017-83107 A | 5/2017 | |
| KR | 101461057 B1 * | 11/2014 | F25B 30/00 |
| WO | 2017/119113 A1 | 7/2017 | |

OTHER PUBLICATIONS

International Search Report and Written Opinion mailed on Jan. 14, 2020, received for PCT Application PCT/JP2019/048132, filed on Dec. 9, 2019, 11 pages including English Translation.

Chaix et al., "Development of a two-phase mechanically pumped loop (2ΦMPL) for the thermal dissipation management of spacecraft : Simulation and test results", 44th International Conference on Environmental Systems, Jul. 13-17, 2014, pp. 1-17.

International Search Report and Written Opinion mailed on Oct. 27, 2020, received for PCT Application PCT/JP2020/029826, filed on Aug. 4, 2020, 8 pages including English Translation.

Extended European Search Report mailed on Nov. 16, 2022, received for EP Application 19955916.2, 8 pages.

Chen et al., "A Robust Two-Phase Pumped Loop with Multiple Evaporators and Multiple Radiators for Spacecraft Applications", 47th International Conference on Environmental Systems, Jul. 16-20, 2017, Charleston, South Carolina, 15 pages.

US Office Action issued Jun. 4, 2024, in co-pending U.S. Appl. No. 17/771,037, 12pp.

Office Action dated Jul. 3, 2024 issued in the European Patent Application No. 19955916.2, which corresponds to U.S. Appl. No. 17/771,037, 6pp.

US Office Action dated Oct. 25, 2024, issued in co-pending U.S. Appl. No. 17/771,037, 26pp.

* cited by examiner

COOLING APPARATUS

CROSS-REFERENCE TO RELATED APPLICATIONS

The present application is based on PCT filing PCT/JP2020/029826, filed Aug. 4, 2020, the entire contents of which are incorporated herein by reference. This application is also a co-pending application of U.S. patent application Ser. No. 17/771,037, entitled COOLING DEVICE AND ARTIFICIAL SATELLITE, filed Apr. 22, 2022.

TECHNICAL FIELD

The present disclosure relates to a cooling apparatus to cool a heat-generating instrument and a space structure including the cooling apparatus.

BACKGROUND ART

In a space structure, heat pipes that conduct heat are embedded in a casing in which an electronic instrument is housed and panels supporting the electronic instrument inside the casing. Heat generated in the electronic instrument inside the casing is conducted to a radiation surface of the casing via the heat pipes. The heat conducted to the radiation surface is radiated from the radiation surface toward deep space. As a result, the electronic instrument is cooled.

Non-Patent Literature 1 describes a cooling apparatus that transfers heat from an electronic instrument to a radiation surface by forcibly transferring a refrigerant using a pump instead of using heat pipes.

CITATION LIST

Non-Patent Literature

Non-Patent Literature 1: "A Robust Two-Phase Pumped Loop with Multiple Evaporators and Multiple Radiators for Spacecraft Applications", 47th International Conference on Environmental Systems 16-20 Jul. 2017, ICES-2017-221

SUMMARY OF INVENTION

Technical Problem

When the electronic instrument inside the space structure is to be cooled using the heat pipes, the heat pipes are connected at a plurality of points along a heat path from the electronic instrument to the radiation surface. Therefore, contact heat resistance between the heat pipes is high, and cooling efficiency decreases. In addition, the mass of the space structure increases.

To reduce the connections between the heat pipes, the electronic instrument needs to be placed near the radiation surface of the casing. Therefore, if the connections between the heat pipes are to be reduced, electronic instruments that generate much heat cannot be placed densely in the center part inside the casing.

By using a cooling apparatus using a pump as described in Non-Patent Literature 1, a refrigerant can be directly provided to an electronic instrument placed in the center part inside the casing. However, in such a cooling apparatus, refrigerant liquid in a supercooled state needs to flow into and out of the pump in order to prevent malfunction due to vapor flowing into the pump. When the refrigerant liquid in the supercooled state flows into and out of the pump, in order to prevent uneven cooling in a cooler of the electronic instrument located downstream of the pump, the refrigerant before flowing into the pump needs to be cooled to a sufficient degree of supercooling and the supercooled refrigerant liquid after flowing out from the pump and before flowing into the cooler needs to be heated to around a saturation temperature. However, as the degree of supercooling of the refrigerant in the pump increases, the amount of heat to be generated and transferred for heating the refrigerant to around the saturation temperature increases, leading to an increase in the electric power consumption of the cooling apparatus.

An object of the present disclosure is to make it possible to stably and evenly cool, with low electric power consumption, a heat-generating instrument such as an electronic instrument.

Solution to Problem

A cooling apparatus according to the present disclosure cools a heat-generating instrument installed in an installation apparatus, and includes a refrigerant flow path that is configured circularly by sequentially connecting a pump that circulates a refrigerant in a liquid state, a cooler that cools the heat-generating instrument with the refrigerant, and a radiator that cools the refrigerant;

a discharge-side heat exchanger that is provided in a flow path from the pump to the cooler in the refrigerant flow path;

a suction-side heat exchanger that is provided in a flow path from the radiator to the pump in the refrigerant flow path; and a Peltier device that is provided between the discharge-side heat exchanger and the suction-side heat exchanger, and transfers heat from the refrigerant flowing through the suction-side heat exchanger to the refrigerant flowing through the discharge-side heat exchanger.

Advantageous Effects of Invention

In the present disclosure, heat can be efficiently transferred using a Peltier device from a refrigerant flow path from a radiator to a pump to a refrigerant flow path from the pump to a cooler. This makes it possible, with low electric power consumption, to heat a refrigerant flowing into the cooler to around a saturation temperature to prevent uneven cooling of a heat-generating instrument, and also increase a degree of supercooling of the refrigerant to be sucked into the pump to suppress inflow of vapor into the pump so as to prevent occurrence of malfunction.

DESCRIPTION OF EMBODIMENTS

Embodiment 1

*Description of Configurations*

Figure 1:
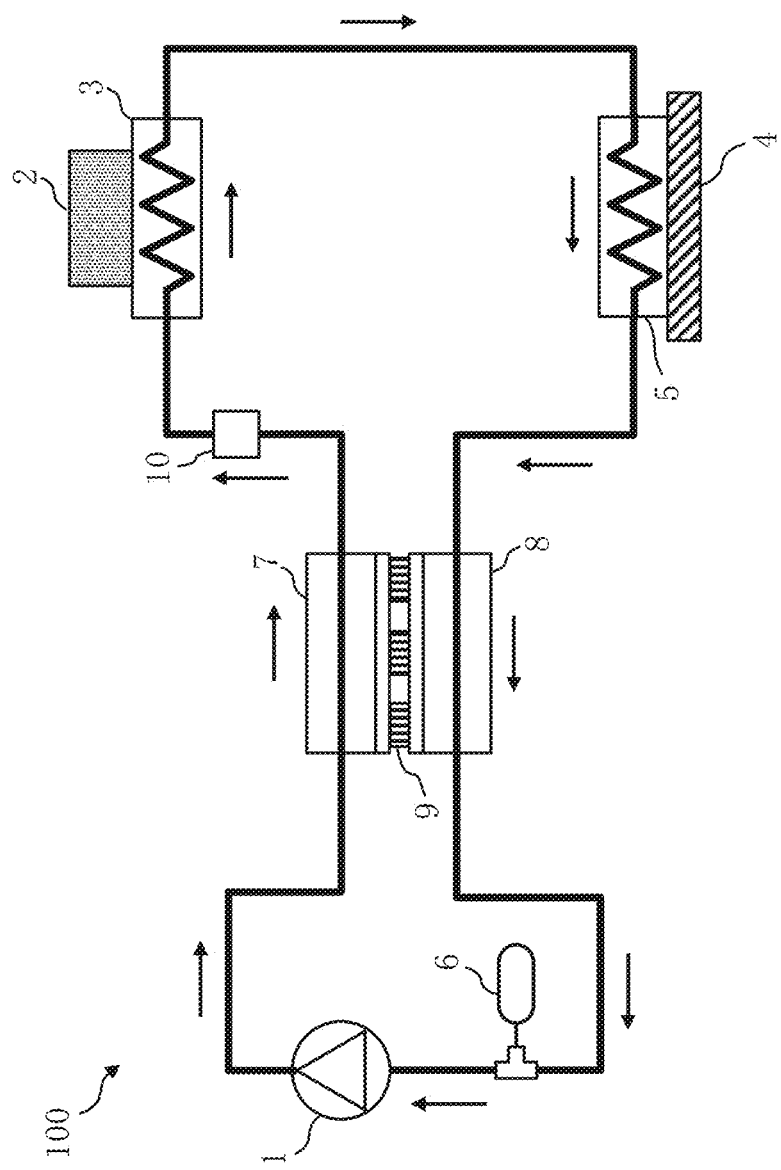
FIG. 1 is a refrigerant circuit diagram of a cooling apparatus 100 according to Embodiment 1.
Figure 2:
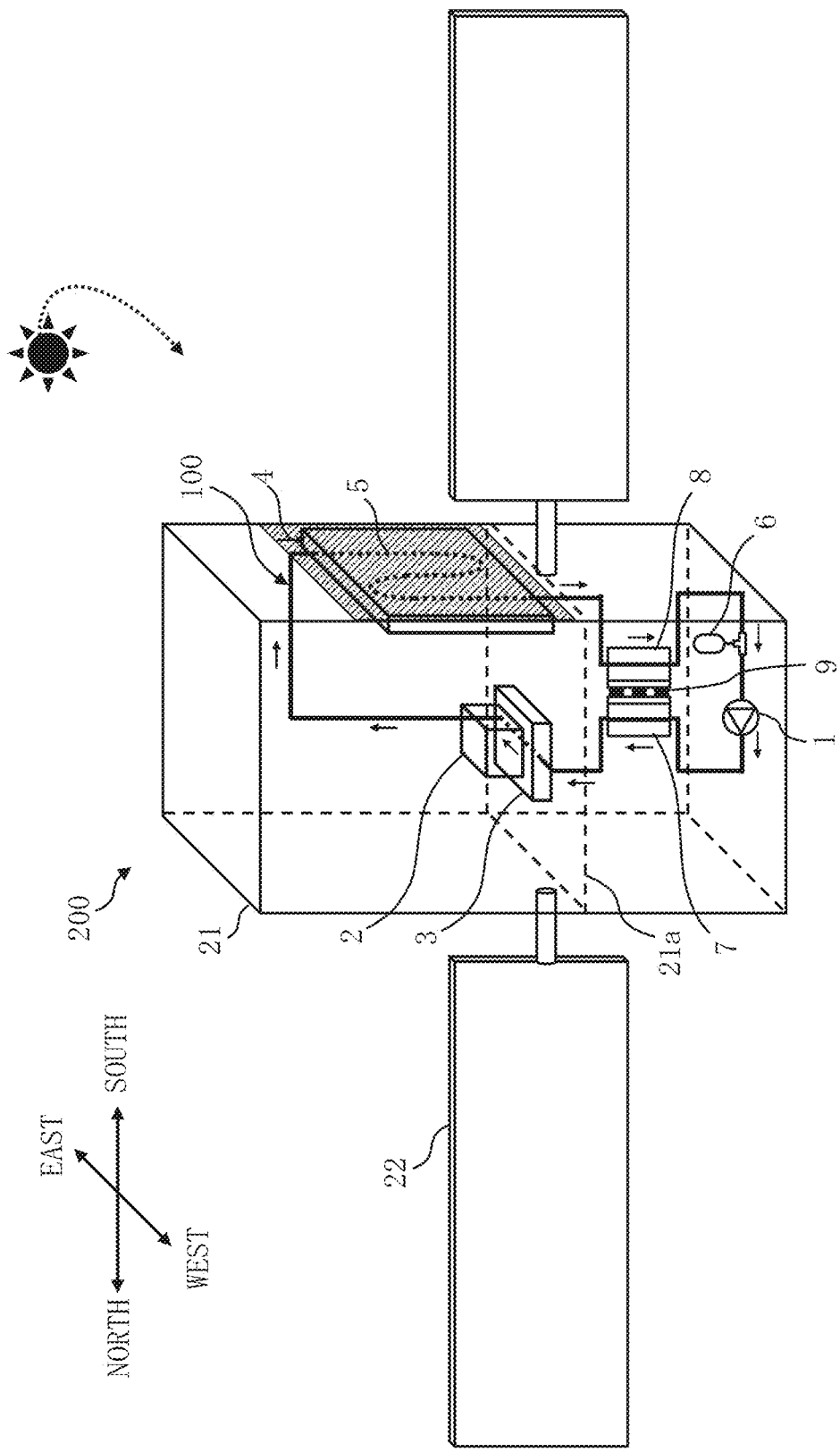
FIG. 2 is an outline configuration diagram of an artificial satellite 200 including the cooling apparatus 100 according to Embodiment 1.

Referring to FIGS. 1 and 2, configurations of a cooling apparatus 100 and an artificial satellite 200, which is an installation apparatus in which the cooling apparatus 100 is installed, according to Embodiment 1 will be described. The artificial satellite 200 is an example of a space structure.

In FIGS. 1 and 2, solid arrows indicate a main flow direction of a refrigerant.

<Basic Configurations>

The cooling apparatus 100 includes a closed-loop refrigerant flow path in which a pump 1, a cooler 3, and a radiator 5 are sequentially connected with pipes and through which the refrigerant circulates. The refrigerant circulates such that the refrigerant is pressurized in a liquid state in the pump 1, receives heat from an electronic instrument 2 in the cooler 3 so as to cool the electronic instrument 2, radiates heat in the radiator 5, and returns to the pump 1 again. The cooler 3 is provided inside the electronic instrument 2 or in contact with the electronic instrument 2 so that it receives heat generated in the electronic instrument 2 to heat the refrigerant inside. The radiator 5 cools the refrigerant that has been heated in the cooler 3 as a result of cooling the electronic instrument 2.

The artificial satellite 200 includes the electronic instrument 2 and the cooling apparatus 100 inside a main body 21. The electronic instrument 2 and the cooling apparatus 100 are supported by a frame 21a. The electronic instrument 2 is an apparatus including instruments for carrying out various missions and instruments that control these instruments. The cooling apparatus 100 is an apparatus that cools the electronic instrument 2 by transferring heat generated when the electronic instrument 2 operates to a radiation surface 4 and releasing the heat to the outside of the artificial satellite 200.

The radiator 5 of the artificial satellite 200 is provided inside the radiation surface 4 or in contact with the radiation surface 4 provided on the outer surface of the main body 21 so that the refrigerant heated in the cooler 3 is cooled. The heat received by the radiator 5 from the refrigerant is radiated from the radiation surface 4 toward deep space outside the artificial satellite 200.

<Supplement to Basic Configurations>

In the artificial satellite 200 orbiting a planet, the radiation surface 4 may preferably be provided on each of the south and north faces or either of the south and north faces to prevent a decrease in the amount of radiated heat or prevent receiving heat as a result of receiving strong solar radiation on the radiation surface 4. The radiator 5 and the radiation surface 4 may be divided into a plurality of parts, and flow paths may preferably be connected in series or in parallel.

If it is possible to switch the flow path so that the refrigerant heated in the cooler 3 flows to the radiator 5 provided at the radiation surface 4 that is in the shade, the radiation surface 4 and the radiator 5 may be provided on the east or west face, and the heated refrigerant may flow from the cooler 3 to the radiator 5 on the side that is in the shade and the refrigerant may be cooled by releasing heat from the radiation surface 4.

<Characteristic Configurations>

In the cooling apparatus 100, a discharge-side heat exchanger 7 is provided between discharge of the refrigerant from the pump 1 and arrival of the refrigerant at the cooler 3, and a suction-side heat exchanger 8 is provided between outflow of the refrigerant from the radiator 5 and suction of the refrigerant into the pump 1. That is, the discharge-side heat exchanger 7 is provided in the flow path from the pump 1 to the cooler 3 in the refrigerant flow path. The suction-side heat exchanger 8 is provided in the flow path from the radiator 5 to the pump 1 in the refrigerant flow path. A Peltier device 9 is provided to be sandwiched between the discharge-side heat exchanger 7 and the suction-side heat exchanger 8.

The Peltier device 9 transfers heat from the refrigerant flowing through the suction-side heat exchanger 8 to the refrigerant flowing through the discharge-side heat exchanger 7. In particular, the discharge-side heat exchanger 7 and the suction-side heat exchanger 8 are placed so that the flows of the refrigerant inside are countercurrent to each other and heat is exchanged via the Peltier device 9 placed between them, such that heat is exchanged between the refrigerant flowing through the upstream side of the discharge-side heat exchanger 7 and the refrigerant flowing through the downstream side of the suction-side heat exchanger 8 via a corresponding part of the Peltier device 9 between them, and heat is exchanged between the refrigerant flowing through the downstream side of the discharge-side heat exchanger 7 and the refrigerant flowing through the upstream side of the suction-side heat exchanger 8 via a corresponding part of the Peltier device 9 between them.

The Peltier device 9 is a device that can transfer heat from a low-temperature side to a high-temperature side when power is applied. For example, the Peltier device 9 is a device that transfers heat by passing an electric current through a semiconductor device with a p-n junction, and is generally formed as a flat plate to exchange heat between its both faces.

<Other Configurations>

In the cooling apparatus 100, an accumulator 6 is provided to branch from the refrigerant flow path from outflow of the refrigerant from the radiator 5 to suction of the refrigerant into the pump 1. The accumulator 6 accumulates refrigerant liquid inside, and adjusts a ratio of the gas phase and the liquid phase, a pressure, and a saturation vapor temperature of the refrigerant circulating through each component of the cooling apparatus 100, depending on the amount of accumulated refrigerant liquid. In order to allow the amount of refrigerant liquid inside to be adjusted, the accumulator 6 is of a mechanical type that can directly change the internal volume mechanically or a thermal type that changes the ratio of the gas phase and the liquid phase of the refrigerant inside the accumulator by heating and cooling.

In the cooling apparatus 100, a vapor generation unit 10 is provided in the refrigerant flow path from outflow of the refrigerant from the discharge-side heat exchanger 7 to inflow of the refrigerant into the cooler 3. The vapor generation unit 10 is configured to generate vapor bubbles in the refrigerant liquid that has flowed out from the discharge-side heat exchanger 7 so as to promote ebullient cooling in the cooler 3. The vapor generation unit 10 generates vapor bubbles by one of methods such as a heater, a laser, electromagnetic waves, and ultrasonic waves. When the amount of pressure rising in the pump 1 is high, the vapor generation unit 10 may utilize a depressurization effect due to, for example, abrupt contraction or abrupt expansion of the flow path.

In generating vapor bubbles, it is not always necessary to heat all the refrigerant liquid flowing through the vapor generation unit 10 to around the saturation vapor temperature, and vapor bubbles may be generated locally and the rest of the refrigerant liquid may remain in a supercooled state. If vapor bubbles can be generated in the discharge-side heat exchanger 7, it is not always necessary to provide the vapor generation unit 10.

The electric power to be used as a power source for the electronic instrument 2, the pump 1, the Peltier device 9, the vapor generation unit 10, and so on of the artificial satellite 200 is obtained from radiated light received on a solar panel 22 from a star such as the sun. The solar panel 22 is provided on each or either one of the south and north faces of the main body 21. The orientation of the solar panel 22 is controlled to be in an east-west direction so that a light-receiving surface faces the radiated light from the sun.

The electric power to be used as a power source for the electronic instrument 2, the pump 1, the Peltier device 9, the vapor generation unit 10, and so on may be supplied from a storage battery inside the artificial satellite 200, or may be generated from fuel using a generator. An instrument that converts or controls electric power, the storage battery, and the generator are included in the electronic instrument 2, which is a heat generating instrument.

*Description of Operation*

The artificial satellite 200 including the cooling apparatus 100 orbits the earth and carries out various missions in orbit by the electronic instrument 2. The electric power required for operation of the electronic instrument 2 and each component of the cooling apparatus 100 such as the pump 1 is supplied from the solar panel 22 or the storage battery or the like included in the electronic instrument 2. The light-receiving surface of the solar panel 22 is controlled to face the sun.

When the electronic instrument 2 operates and generates heat, the pump 1 starts and the refrigerant is supplied to the cooler 3 through the discharge-side heat exchanger 7 and the vapor generation unit 10. The electronic instrument 2 is cooled by transferring heat from the electronic instrument 2 to the refrigerant via the cooler 3. The refrigerant that has received heat from the cooler 3 flows into the radiator 5 to supply heat to the radiation surface 4, passes through the suction-side heat exchanger 8, and returns to the pump 1 again. The heat supplied from the refrigerant to the radiation surface 4 via the radiator 5 is radiated from the radiation surface 4 toward deep space.

In the process where the refrigerant circulates through each component of the cooling apparatus 100, part of the refrigerant liquid evaporates and becomes refrigerant vapor when the refrigerant receives heat in the cooler 3. The refrigerant vapor is cooled in the radiator 5 and returns to the refrigerant liquid again. With such latent heat transfer, high cooling capacity and cooling efficiency can be obtained.

If the amount of heat radiation on the radiation surface 4 is insufficient and part of the refrigerant vapor in the radiator 5 remains and flows into the pump 1 still as the refrigerant vapor, this may cause the pump 1 to malfunction.

In order to prevent vapor from flowing into the pump 1, the refrigerant liquid accumulated in the accumulator 6 is injected into each component of the cooling apparatus 100. This increases the amount of refrigerant liquid in each component of the cooling apparatus 100 except the accumulator 6, so that the saturation vapor pressure rises. This makes it difficult for the refrigerant liquid to evaporate in the cooler 3 and condensation of the refrigerant vapor in the radiator 5 is facilitated.

However, if the refrigerant liquid is injected from the accumulator 6 into each component of the cooling apparatus 100, this makes it difficult for the refrigerant liquid to evaporate in the cooler 3 and the saturation evaporation temperature of the refrigerant rises. As a result, the temperature of the cooler 3 as a whole rises, lowering cooling capacity and cooling efficiency. Therefore, the accumulator 6 is controlled so that the amount of refrigerant liquid inside the accumulator 6 is an appropriate amount.

If only the refrigerant liquid in a supercooled state flows into the cooler 3 as a result of injecting the refrigerant liquid from the accumulator 6 into each component of the cooling apparatus 100, a boiling delay may occur where the refrigerant liquid near the heat transfer surface inside the cooler 3 does not start boiling even if it exceeds the saturation vapor temperature. In this case, the temperature of the heat transfer surface rises significantly compared to when boiling is started to cause cooling by latent heat, and uneven cooling or insufficient cooling may occur in the electronic instrument 2.

In order to prevent a boiling delay from occurring in the cooler 3, the vapor generation unit 10 generates vapor bubbles in advance and causes the refrigerant containing the vapor bubbles to flow into the cooler 3. This promotes latent heat cooling utilizing a phase change from the liquid phase to the gas phase due to growth of the vapor bubbles in the cooler 3 so as to prevent a boiling delay.

However, if the refrigerant liquid is injected from the accumulator 6 into each component of the cooling apparatus 100 to increase the degree of supercooling of the refrigerant liquid to be sucked into the pump 1 in order to prevent bubbles that have failed to condense in the radiator 5 from flowing into the pump 1, the degree of supercooling of the refrigerant liquid discharged from the pump 1 also increases. Then, the electric power consumption of the vapor generation unit 10 required to generate vapor bubbles in the vapor generation unit 10 and maintain the bubbles until they flow into the cooler 3 increases.

Thus, using the Peltier device 9 sandwiched between the discharge-side heat exchanger 7 and the suction-side heat exchanger 8, heat is transferred from the refrigerant flowing through the suction-side heat exchanger 8 to the refrigerant flowing through the discharge-side heat exchanger 7. As a result, the refrigerant flowing through the suction-side heat exchanger 8 is cooled, and the refrigerant which has a greater degree of supercooling than that at immediately after flowing out from the radiator 5 and in which dissipation of bubbles has been prompted is sucked into the pump 1. The refrigerant that has heated by heat received from the refrigerant flowing through the suction-side heat exchanger 8 and the amount of heat consumed in the Peltier device 9, resulting in facilitation of evaporation, flows out from the discharge-side heat exchanger 7 and flows into the vapor generation unit 10. Therefore, the electric power consumption of the vapor generation unit 10 is reduced significantly.

In the discharge-side heat exchanger 7 and the suction-side heat exchanger 8, the flows of the refrigerant inside are countercurrent to each other and heat is exchanged via the Peltier device 9 placed between them so that heat is transferred from the refrigerant flowing on the downstream side of the suction-side heat exchanger 8 to the refrigerant flowing on the upstream side of the discharge-side heat exchanger 7 and heat is transferred from the refrigerant flowing on the upstream side of the suction-side heat exchanger 8 to the refrigerant flowing on the downstream side of the discharge-side heat exchanger 7. Therefore, a temperature difference is small between both end faces that are orthogonal to a heat transfer direction in each part of the Peltier device 9. In the Peltier device 9, the smaller the temperature difference between the both end faces, the higher the efficiency of transferring heat in the opposite direction from the end face on a low-temperature side to the end face on a high-temperature side. Therefore, with low electric power consumption, the refrigerant to be sucked into the pump 1 can be cooled to increase the degree of supercooling and the refrigerant discharged from the pump 1 can be heated to decrease the degree of supercooling.

Effects of Embodiment 1

Figure 3:
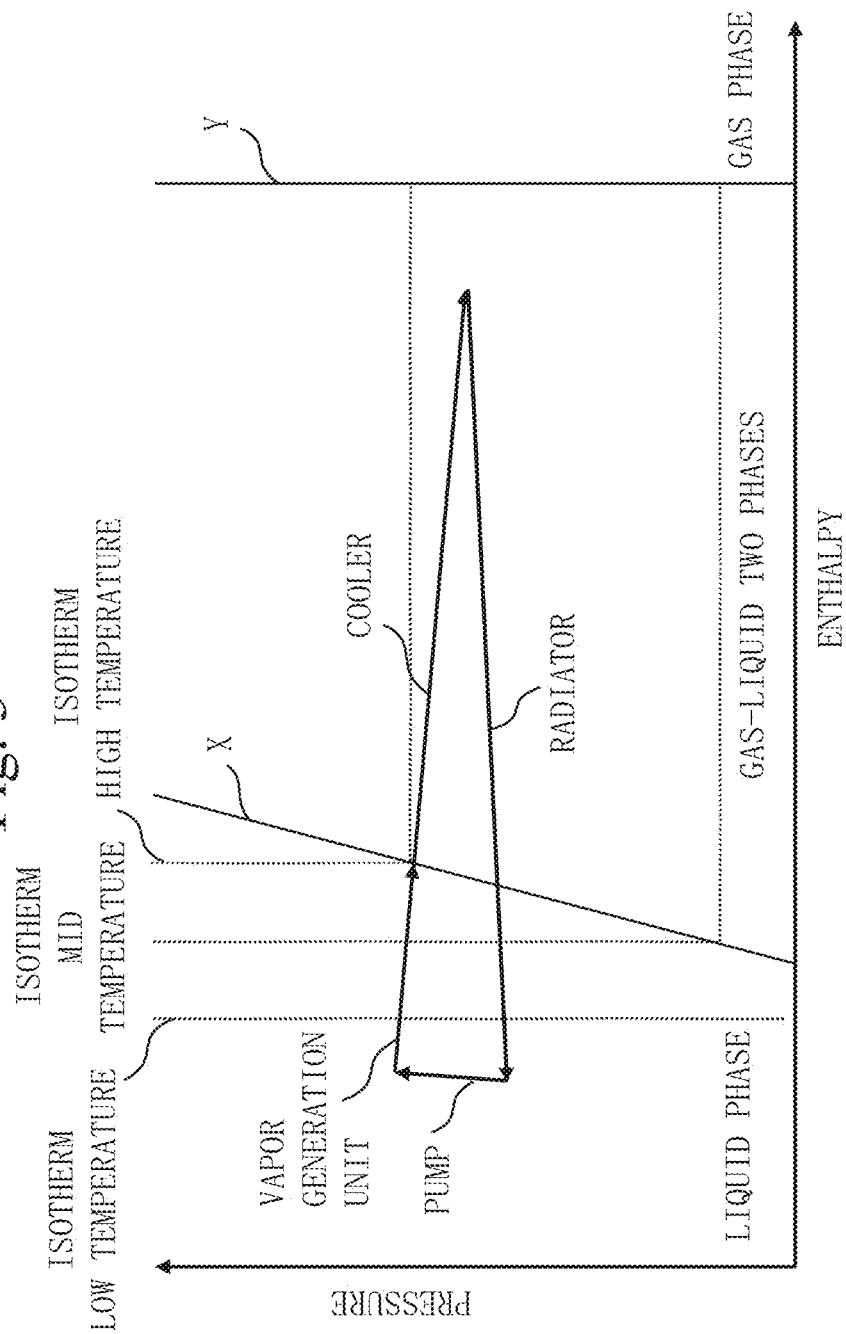
FIG. 3 is a state-transition schematic diagram of a conventional cooling apparatus.
Figure 4:
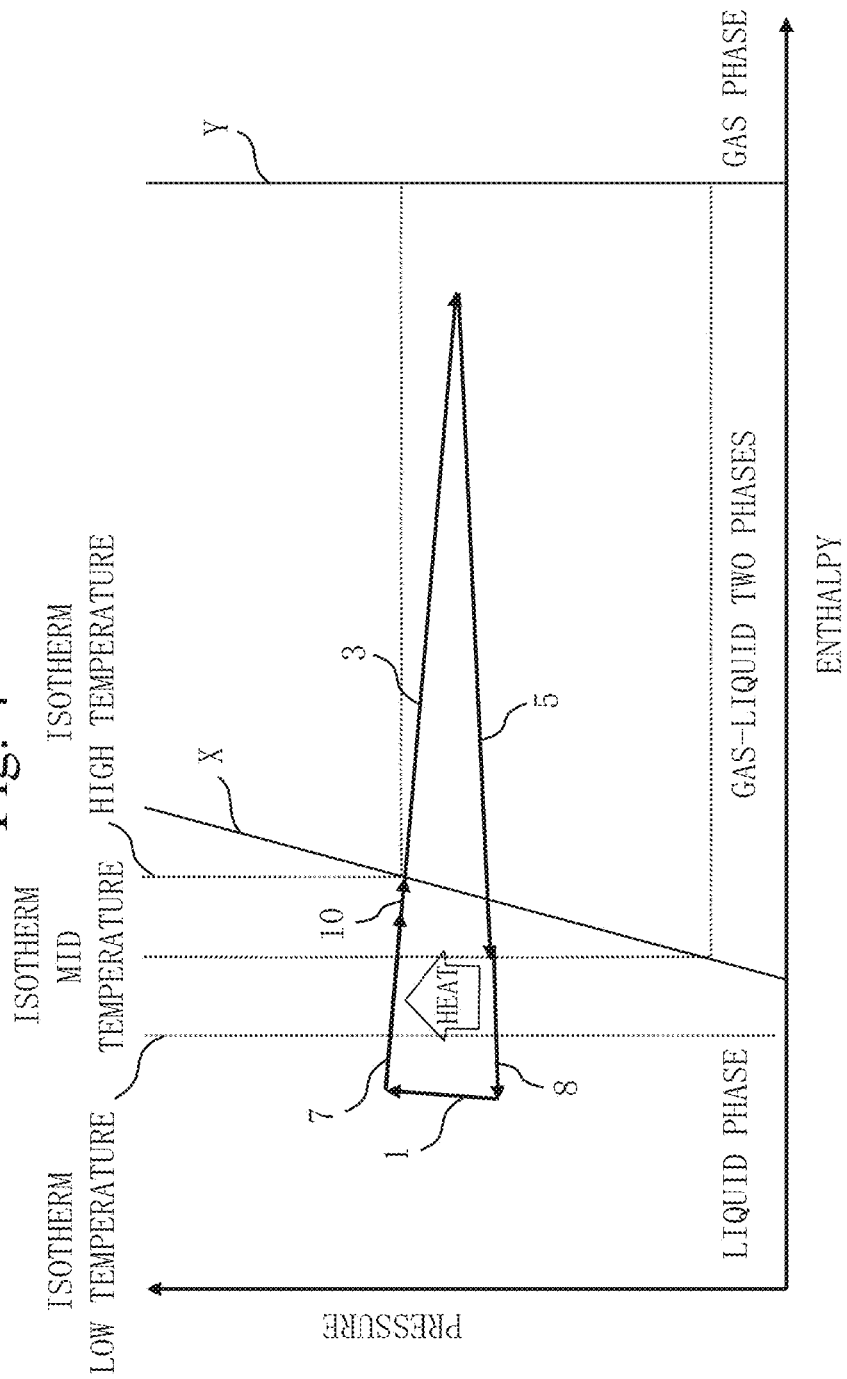
FIG. 4 is a state-transition schematic diagram of the cooling apparatus 100 according to Embodiment 1.

Referring to FIGS. 3 and 4, effects of the cooling apparatus 100 according to Embodiment 1 will be described.

FIG. 3 is a schematic diagram illustrating a state change of a cooling apparatus of conventional art. FIG. 4 is a schematic diagram illustrating a state change of the cooling apparatus 100 according to Embodiment 1. In the graphs of FIGS. 3 and 4, the vertical axis indicates pressure and the horizontal axis indicates enthalpy. In the graphs of FIGS. 3 and 4, a solid line X on a low enthalpy side indicates a saturation condensation curve, which is a boundary between a liquid phase and two phases, and a solid line Y on a high enthalpy side indicates a saturation evaporation curve, which is a boundary between the two phases and a gas phase. In the graphs of FIGS. 3 and 4, solid arrows indicate state transitions of the refrigerant. In the cooling apparatus of conventional art illustrated in FIG. 3, the solid arrows indicate a circulation path that sequentially passes through a pump, a vapor generation unit, a cooler, and a radiator and then returns to the pump. In the cooling apparatus 100 according to Embodiment 1 illustrated in FIG. 4, the solid arrows indicate a circulation path that sequentially passes through the pump 1, the discharge-side heat exchanger 7, the vapor generation unit 10, the cooler 3, the radiator 5, and the suction-side heat exchanger 8, and then returns to the pump 1 again. An arrow in which the word "HEAT" is enclosed by a visible outline indicated in FIG. 4 schematically represents transfer of heat by the Peltier device 9.

In the conventional cooling apparatus utilizing latent heat, the refrigerant is circulated using the pump, part of refrigerant liquid is evaporated in the cooler, and refrigerant vapor is condensed in the radiator. In the conventional cooling apparatus utilizing latent heat, the refrigerant in a liquid state is circulated by raising the pressure in the pump in order to increase the circulation amount of the refrigerant. If vapor flows into the pump for refrigerant liquid, it may cause malfunction. Therefore, a supercooled state needs to be secured so that the enthalpy of the refrigerant before flowing into the pump is lower than a saturation condensation enthalpy.

When the supercooled state before flowing into the pump is secured, the refrigerant liquid after pressurization in the pump is also in a state in which supercooling is secured. Then, evaporation will not start unless the amount of heat is applied which is equivalent to a difference between the enthalpy at the point after the pressure is raised in the pump and the saturation condensation enthalpy. Therefore, on the inflow side of the cooler, heat is exchanged in a liquid single phase. When the supercooled liquid flows into the cooler in a single-phase state, even if the refrigerant liquid near the inner wall of the cooler exceeds the saturation vapor temperature, bubble nuclei are not generated and do not grow, resulting in a boiling delay and a decreased heat transfer coefficient. As a result, uneven cooling may occur on the inlet and outlet sides of the cooler and the temperature of an electric instrument attached to the inlet side of the cooler may rise.

In order to secure a supercooled state before flowing into the pump and cause boiling to start immediately on the inflow side of the cooler, vapor bubbles are generated in advance in the vapor generation unit. However, even if vapor is generated in the refrigerant liquid with a high degree of supercooling, bubbles may not grow and condensation may occur immediately. Therefore, as indicated in FIG. 3, vapor bubbles need to be generated in a state in which the supercooled refrigerant liquid immediately after being discharged from the pump is heated to around the saturation condensation curve in the vapor generation unit. However, as indicated in FIG. 3, this method requires that heating be performed in the vapor generation unit with the amount of heat equivalent to the difference between the enthalpy at the point after the pressure is raised in the pump and the saturation condensation enthalpy, so that as much electric power as that amount of heat is consumed in the vapor generation unit.

In addition, as indicated in FIG. 3, the refrigerant needs to be cooled in the radiator so that the degree of supercooling is sufficiently high to prevent bubbles from flowing into the pump. The outlet side of the radiator becomes almost a single phase of the supercooled refrigerant liquid, resulting in sensible heat exchange in which a temperature gradient occurs in the refrigerant liquid near the inner wall surface of the radiator, and the heat transfer coefficient decreases significantly compared to that in latent heat exchange using condensation of the gas phase. In order to increase the degree of supercooling of the refrigerant flowing out from the radiator, a low temperature source that is lower than the temperature of the refrigerant flowing out from the radiator is required. Thus, in a space structure such as an artificial satellite, the temperature of the radiation surface becomes low and the amount of heat radiation decreases.

As described above, a problem of the conventional cooling apparatus is that if the accumulator is controlled so that bubbles do not flow into the pump in order to prevent the pump from malfunctioning, the cooling performance and cooling efficiency of the entire cooling apparatus are reduced.

In the cooling apparatus 100 according to Embodiment 1, the refrigerant to be sucked into the pump 1 is cooled via the suction-side heat exchanger 8 by the cooling action of the Peltier device 9 so as to increase the degree of supercooling. The amount of heat obtained by cooling the refrigerant and the amount of heat generated in the Peltier device 9 itself are applied via the discharge-side heat exchanger 7 to the refrigerant discharged from the pump 1 so as to reduce the degree of supercooling. As a result, as indicated in FIG. 4, the amount of heat required to heat the refrigerant discharged from the pump 1 to around the saturation condensation enthalpy can be reduced by the amount of reduction in the enthalpy in the suction-side heat exchanger 8. In comparison to the conventional case of heating only by the vapor generation unit, the amount heat applied to the refrigerant by the vapor generation unit 10 is greatly reduced, and electric power consumption is also greatly reduced accordingly.

Furthermore, the flows of the refrigerant inside the discharge-side heat exchanger 7 and the suction-side heat exchanger 8 are countercurrent to each other and heat is exchanged via the Peltier device 9 placed between them, so that a temperature difference is small between the both end faces orthogonal to the heat transfer direction in each part of the Peltier device 9. In the Peltier device 9, the smaller the temperature difference between the both end faces, the higher the efficiency of transferring heat from the end face on the low-temperature side to the end face on the high-temperature side, so that low electric power consumption is also achieved in the Peltier device 9.

The total electric power consumption in the Peltier device 9 and the vapor generation unit 10 can be greatly reduced in comparison to the conventional case of heating only in the vapor generation unit.

Since the refrigerant is cooled in the suction-side heat exchanger 8 to increase the degree of supercooling, in the radiator 5 it is not necessary to cool the refrigerant to achieve a sufficiently high degree of supercooling and it is sufficient that the refrigerant can be cooled until the enthalpy of the refrigerant after flowing out from the radiator 5 is slightly smaller than the saturation condensation enthalpy. Therefore, the temperature of the radiation surface 4, which is a low temperature source to which the radiator 5 of the cooling apparatus 100 installed in the artificial satellite 200 radiates heat, can be set to be higher than the temperature of the radiation surface of the artificial satellite in which the conventional cooling apparatus is installed. This makes it possible to increase the amount of radiated heat to enhance the cooling capacity and cooling efficiency of the cooling apparatus 100.

There may be a case where the amount of heat generated in the electronic instrument 2 is high and the amount of solar radiation received at the radiation surface 4 is high, so that the temperature of the radiation surface 4 is kept high. Even in this case, the refrigerant liquid flowing into the pump 1 via the suction-side heat exchanger 8 can be cooled in the Peltier device 9, so that the temperature of the refrigerant liquid flowing into the pump 1 can be made lower than the temperature of the radiation surface 4 so as to increase the degree of supercooling. Furthermore, bubbles entering the pump 1 can be suppressed to prevent malfunction.

Depending on the operating conditions of the cooling apparatus 100, there may be a case where bubbles dissipate even when the degree of supercooling is low in the radiator 5 and the Peltier device 9 does not need to be activated. In this case, the temperature of the refrigerant flowing through the discharge-side heat exchanger 7 and the temperature of the refrigerant flowing through the suction-side heat exchanger 8 are roughly the same, so that heat is not exchanged between the discharge-side heat exchanger 7 and the suction-side heat exchanger 8 via the Peltier device 9 and the operation of the cooling apparatus 100 is not adversely affected.

As described above, the cooling apparatus 100 according to Embodiment 1 can cool the electronic instrument 2 evenly with low electric power consumption and high cooling capacity while operating stably and with a long life.

*Supplement*

Figure 5:
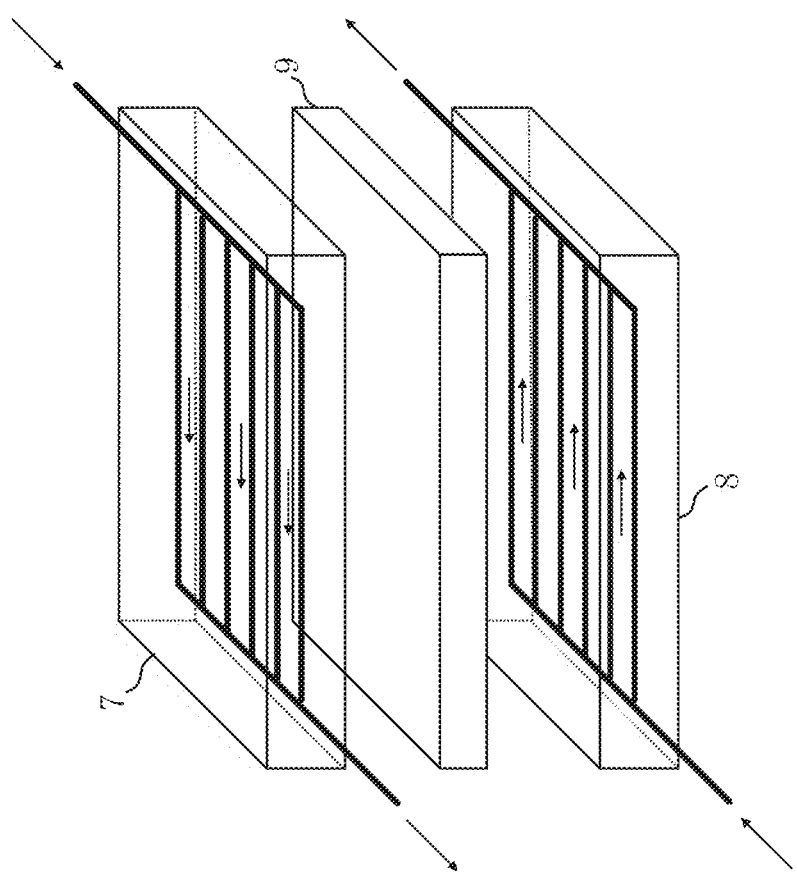
FIG. 5 is an exploded perspective view indicating a structural example of a discharge-side heat exchanger 7, a suction-side heat exchanger 8, and a Peltier device 9 according to Embodiment 1.

Referring to FIG. 5, a structural example of the discharge-side heat exchanger 7, the suction-side heat exchanger 8, and the Peltier device 9 according to Embodiment 1 will be described.

In FIG. 5, solid arrows indicate the main flow direction of the refrigerant.

In the structural example in FIG. 5, a plurality of parallel flow paths are provided inside each of the discharge-side heat exchanger 7 and the suction-side heat exchanger 8. In the discharge-side heat exchanger 7 and the suction-side heat exchanger 8, the flows of the refrigerant inside are countercurrent to each other so that heat is exchanged between the refrigerant on the upstream side of the discharge-side heat exchanger 7 and the refrigerant on the downstream side of the suction-side heat exchanger 8 via a part of the Peltier device 9 placed between them, and heat is exchanged between the refrigerant on the downstream side of the discharge-side heat exchanger 7 and the refrigerant on the upstream side of the suction-side heat exchanger 8 via a part of the Peltier device 9 placed between them.

With this configuration, heat is exchanged between the low-temperature refrigerant on the upstream side of the discharge-side heat exchanger 7 and the low-temperature refrigerant on the downstream side of the suction-side heat exchanger 8, and heat is exchanged between the high-temperature refrigerant on the downstream side of the discharge-side heat exchanger 7 and the high-temperature refrigerant on the upstream side of the suction-side heat exchanger 8. Therefore, in the heat transfer direction orthogonal to the both faces of the Peltier device 9, the temperature difference is small between the end face on the discharge-side heat exchanger 7 side and the opposite end face on the suction-side heat exchanger 8 side in the heat transfer path of each part, so that heat can be transferred efficiently. As a result, the electric power consumption of the Peltier device 9 is reduced.

FIG. 5 illustrates the example in which the plurality of parallel flow paths are provided inside each of the discharge-side heat exchanger 7 and the suction-side heat exchanger 8. However, flow paths may be arranged in series, provided that the refrigerant flowing through the discharge-side heat exchanger 7 and the refrigerant flowing through the suction-side heat exchanger 8 are countercurrent to each other. With the parallel flow paths, when bubbles flow through one of the flow paths of the suction-side heat exchanger 8, the pressure loss increases and the flow slows down in that flow path, so that the bubbles are cooled intensively and dissipation is facilitated. When bubbles are generated in one of the flow paths of the discharge-side heat exchanger 7, the pressure loss increases and the flow slows down in that flow path, so that the bubbles are heated more intensively and grow. Therefore, inflow of bubbles into the cooler 3 is facilitated even without the vapor generation unit 10.

\*\*\*Other Configurations\*\*\*

<Variation 1 of Embodiment 1>

Figure 6:
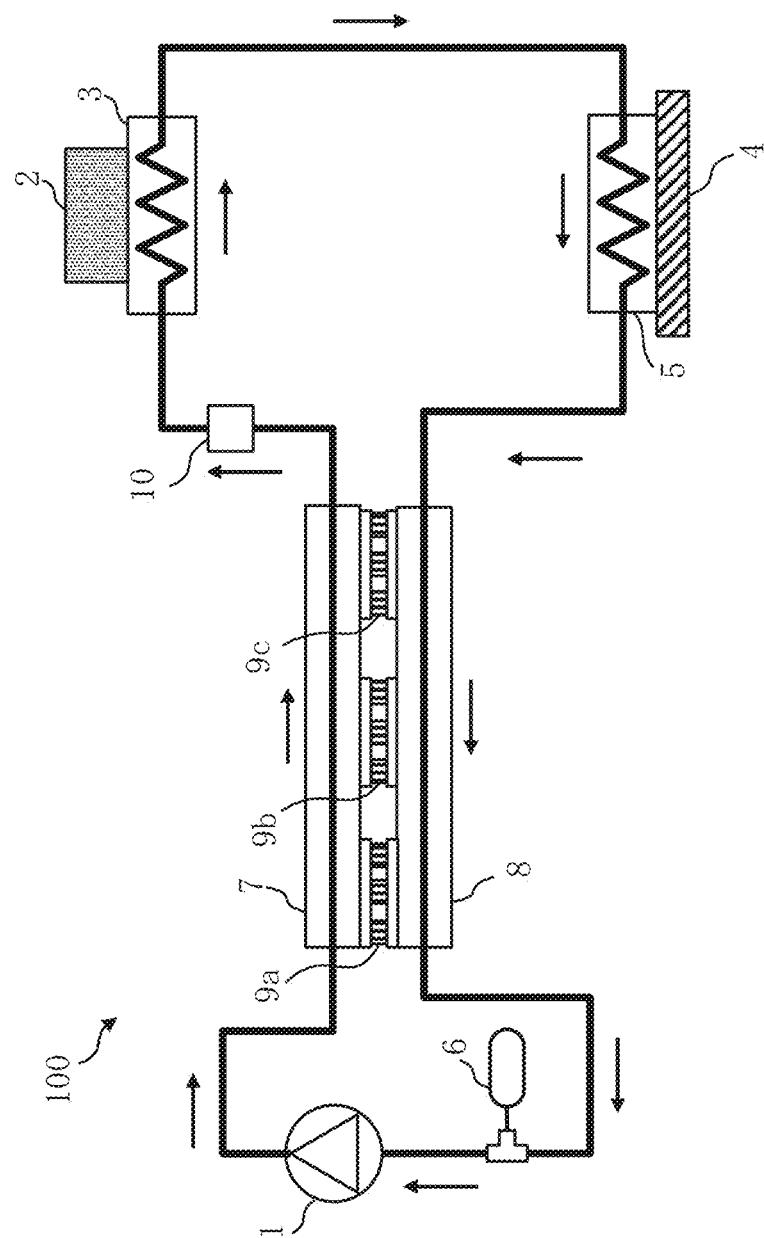
FIG. 6 is a refrigerant circuit diagram of the cooling apparatus 100 according to Variation 1 of Embodiment 1.

Referring to FIG. 6, a configuration of the cooling apparatus 100 according to Variation 1 of Embodiment 1 will be described.

In FIG. 6, solid arrows indicate the main flow direction of the refrigerant.

In the cooling apparatus 100, the Peltier device 9 provided between the discharge-side heat exchanger 7 and the suction-side heat exchanger 8 is divided into a plurality of devices that are spaced apart. In FIG. 6, the Peltier device 9 is divided into a first Peltier device 9a, a second Peltier device 9b, and a third Peltier device 9c. The first Peltier device 9a, the second Peltier device 9b, and the third Peltier device 9c are placed sequentially from the upstream side of the discharge-side heat exchanger 7 and the downstream side of the suction-side heat exchanger 8 to the downstream side of the discharge-side heat exchanger 7 and the upstream side of the suction-side heat exchanger 8.

In the example illustrated in FIG. 6, the configuration in which the Peltier device 9 is divided into three devices, which are the first Peltier device 9a, the second Peltier device 9b, the third Peltier device 9c, is indicated. However, there may be two or four or more Peltier devices 9.

In each Peltier device 9, the direction orthogonal to the both end faces that are in contact with the discharge-side heat exchanger 7 and the suction-side heat exchanger 8 is the direction from the suction-side heat exchanger 8 to the discharge-side heat exchanger 7 and is the main flow direction of heat. However, heat is also transferred by heat conduction in the direction horizontal to the both end faces of the Peltier device 9. That is, heat is transferred from the downstream side to the upstream side of the discharge-side heat exchanger 7 on the surface of the Peltier device 9 in contact with the discharge-side heat exchanger 7, and heat is transferred from the upstream side to the downstream side of the suction-side heat exchanger 8 on the surface in contact with the suction-side heat exchanger 8. Therefore, the temperature difference between the both end faces of the Peltier device 9 is large. As a result, in order to raise the temperature of the refrigerant flowing out from the discharge-side heat exchanger 7 and lower the temperature of the refrigerant flowing out from the suction-side heat exchanger 8, the electric power consumption of the Peltier device 9 increases.

In Variation 1 of Embodiment 1, the Peltier device 9 is divided into a plurality of devices such as the first Peltier device 9a, the second Peltier device 9b, and the third Peltier device 9c, which are arranged sequentially along the flow direction of the refrigerant. Therefore, the first Peltier device 9a exchanges heat between low temperatures of the upstream side of the discharge-side heat exchanger 7 and the downstream side of the suction-side heat exchanger 8, the second Peltier device 9b exchanged heat between middle temperatures of the middle side of the discharge-side heat exchanger 7 and the middle side of the suction-side heat exchanger 8, and the third Peltier device 9c exchanges heat between high temperatures of the downstream side of the discharge-side heat exchanger 7 and the upstream side of the suction-side heat exchanger 8. The first Peltier device 9a, the second Peltier device 9b, and the third Peltier device 9c are separated, so that the transfer of heat between these devices is suppressed. Therefore, the temperature difference between the both end faces can be kept smaller in each temperature zone, allowing more efficient heat exchange.

<Variation 2 of Embodiment 1>

Figure 7:
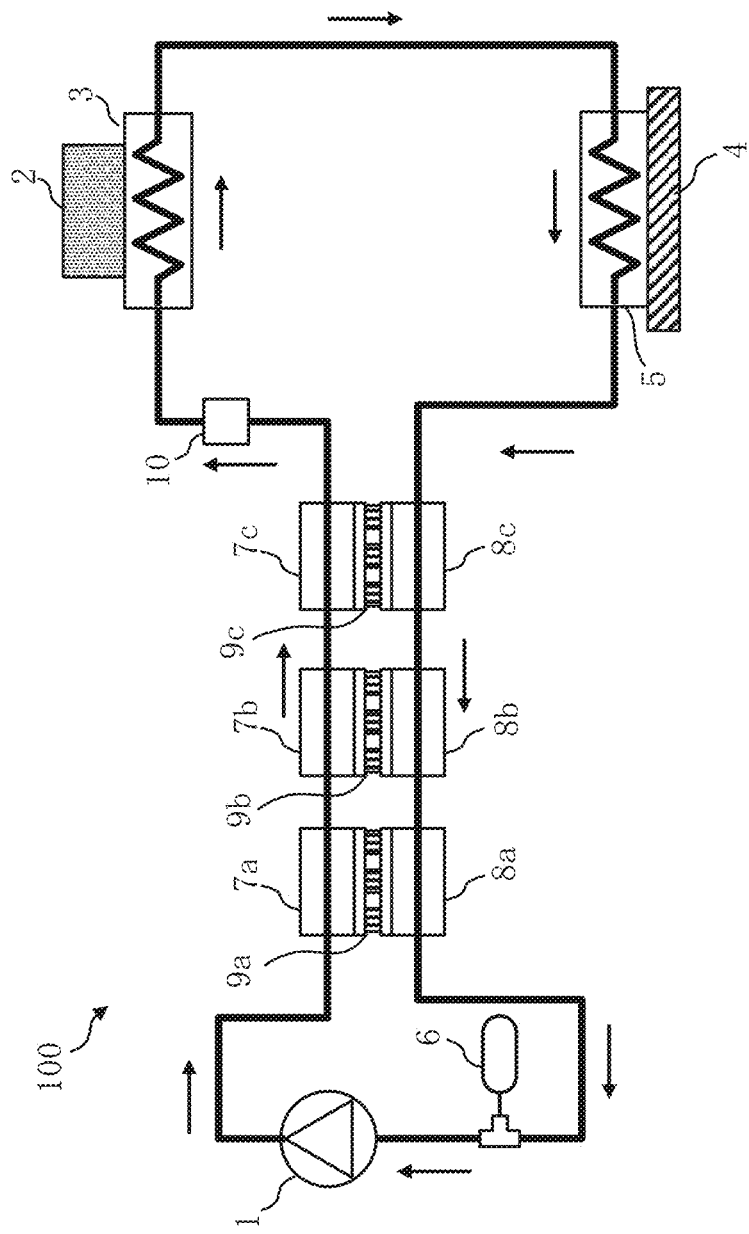
FIG. 7 is a refrigerant circuit diagram of the cooling apparatus 100 according to Variation 2 of Embodiment 1.

Referring to FIG. 7, a configuration of the cooling apparatus 100 according to Variation 2 of Embodiment 1 will be described.

In FIG. 7, solid arrows indicate the main flow direction of the refrigerant.

In Variation 1 of Embodiment 1, the Peltier device 9 is divided into the plurality of devices. The Peltier devices 9 are placed sequentially from the upstream side of the discharge-side heat exchanger 7 and the downstream side of the suction-side heat exchanger 8 to the downstream side of the discharge-side heat exchanger 7 and the upstream side of the suction-side heat exchanger 8.

In Variation 2 of Embodiment 1, like the Peltier device 9, the discharge-side heat exchanger 7 and the suction-side heat exchanger 8 are also divided into a plurality of discharge-side heat exchangers 7 and suction-side heat exchangers 8 that are spaced apart. In FIG. 7, the discharge-side heat exchanger 7 is divided into a first discharge-side heat exchanger 7a, a second discharge-side heat exchanger 7b, and a third discharge-side heat exchanger 7c sequentially from the upstream side after discharge from the pump 1 to the downstream side, and the suction-side heat exchanger 8 is divided into a first suction-side heat exchanger 8a, a second suction-side heat exchanger 8b, and a third suction-side heat exchanger 8c sequentially from the downstream side leading to suction into the pump 1 to the upstream side. That is, the first discharge-side heat exchanger 7a and the first suction-side heat exchanger 8a on the low-temperature side exchange heat via the first Peltier device 9a between them, the second discharge-side heat exchanger 7b and the second suction-side heat exchanger 8b on the middle-temperature side exchange heat via the second Peltier device 9b between them, and the third discharge-side heat exchanger 7c and the third suction-side heat exchanger 8c on the high-temperature side exchange heat via the third Peltier device 9c between them.

That is, the cooling apparatus 100 includes a plurality of sets of the discharge-side heat exchanger 7, the suction-side heat exchanger 8, and the Peltier device 9. The discharge-side heat exchanger 7 placed on a more upstream side in the refrigerant flow path is paired with the suction-side heat exchanger 8 placed on a more downstream side in the refrigerant flow path. Each set of the discharge-side heat exchanger 7 and the suction-side heat exchanger 8 are provided with the Peltier device 9 of that set placed between them.

This suppresses the movement of heat due to heat transfer not only within each of the Peltier devices 9, but also within the discharge-side heat exchangers 7 and within the suction-side heat exchangers 8. The temperature difference between the both end faces of each of the Peltier devices 9 can be further reduced, so that heat exchange can be performed more efficiently.

Embodiment 2

Embodiment 2 differs from Embodiment 1 in that the cooling apparatus 100 includes a bypass branched flow path 101 for adjusting the flow rate of the refrigerant circulating sequentially through each component. In Embodiment 2, this difference will be described and description of the same aspects will be omitted.

*Description of Configurations*

Figure 8:
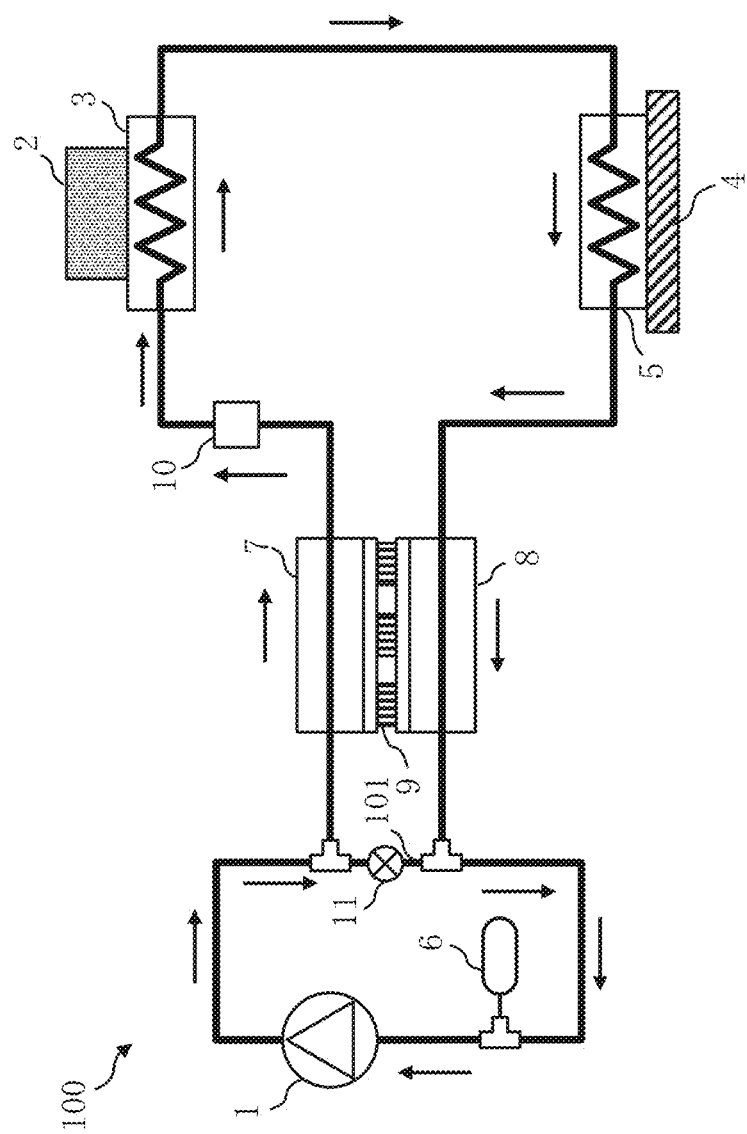
FIG. 8 is a refrigerant circuit diagram of the cooling apparatus 100 according to Embodiment 2.
Figure 9:
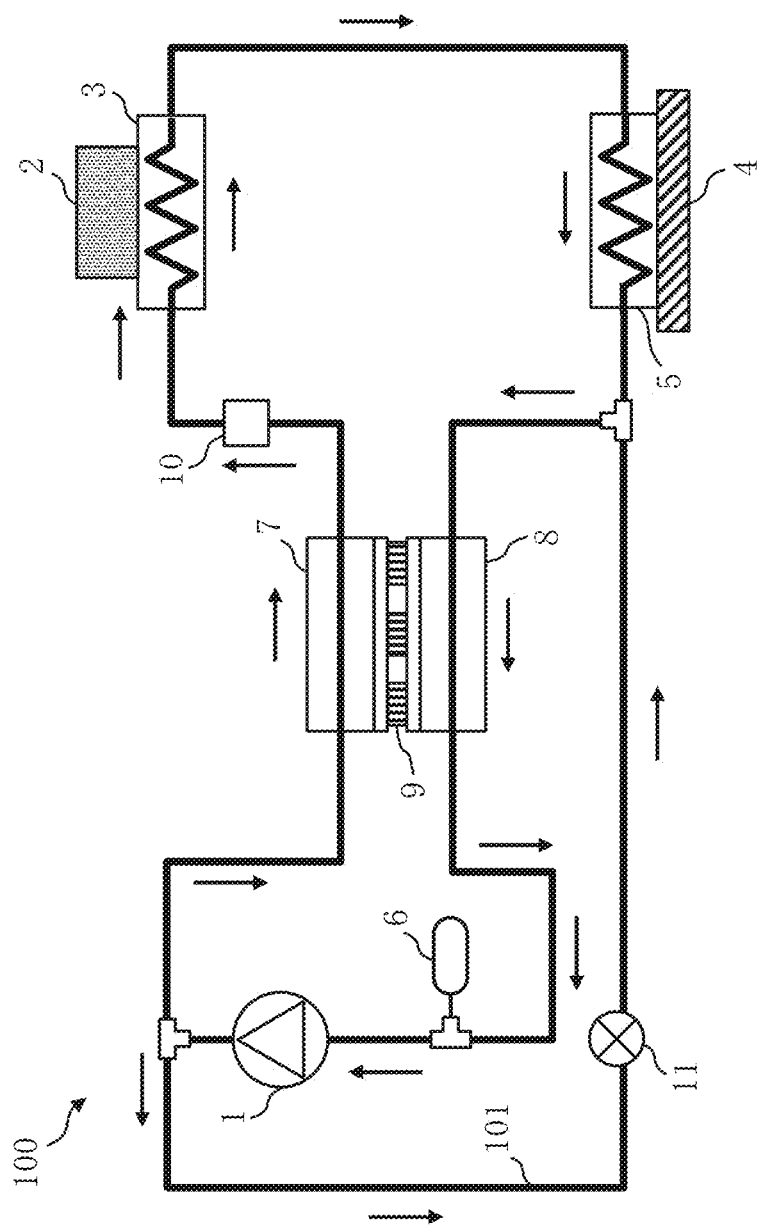
FIG. 9 is a refrigerant circuit diagram of the cooling apparatus 100 according to Embodiment 2.
Figure 10:
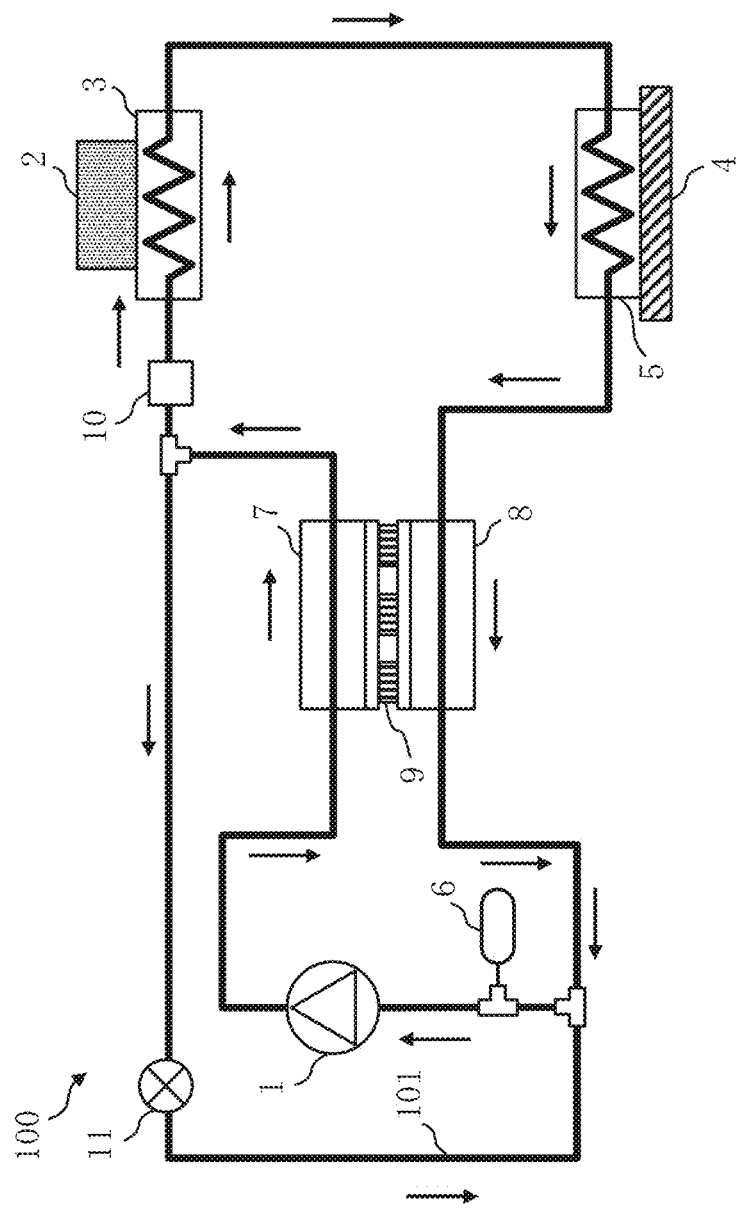
FIG. 10 is a refrigerant circuit diagram of the cooling apparatus 100 according to Embodiment 2.

Referring to FIGS. 8 to 10, configurations of the cooling apparatus 100 according to Embodiment 2 will be described.

In FIGS. 8 to 10, solid arrows indicate the main flow direction of the refrigerant.

The cooling apparatus 100 according to Embodiment 2 includes the bypass branched flow path 101 that branches from the flow path from the pump 1 to the cooler 3 in the refrigerant flow path and joins the flow path from the radiator 5 to the pump 1 in the refrigerant flow path. In the bypass branched flow path 101, a flow rate control valve 11 is provided. The flow rate control valve 11 may be one that only allows opening and closing, but if the degree of opening can be adjusted, finer flow rate control is possible.

As a specific configuration, the cooling apparatus 100 according to Embodiment 2 can be configured as illustrated in one of FIGS. 8 to 10.

In FIG. 8, the bypass branched flow path 101 branches from the flow path between discharge from the pump 1 and inflow into the discharge-side heat exchanger 7, and joins the flow path between outflow from the suction-side heat exchanger 8 and suction into the pump 1. In FIG. 9, the bypass branched flow path 101 branches from the flow path between discharge from the pump 1 and inflow into the discharge-side heat exchanger 7, and joins the flow path between outflow from the radiator 5 and inflow into the suction-side heat exchanger 8. In FIG. 10, the bypass branched flow path 101 branches from the flow path between outflow from the discharge-side heat exchanger 7 and inflow into the vapor generation unit 10, and joins the flow path between outflow from the suction-side heat exchanger 8 and suction into the pump 1.

*Description of Operation*

The cooling apparatus 100 according to Embodiment 2 controls the opening and closing of the flow rate control valve 11 depending on the amount of heat generated in the electronic instrument 2. When the flow rate control valve 11 can adjust the degree of opening, the cooling apparatus 100 according to Embodiment 2 adjusts the degree of opening of the flow rate control valve 11 depending on the amount of heat generated in the electronic instrument 2. As a specific example, when the amount of heat generated in the electronic instrument 2 is low, the cooling apparatus 100 opens the flow rate control valve 11 to reduce the flow rate of the refrigerant circulating through the vapor generation unit 10 and the cooler 3.

*Effects of Embodiment 2*

The cooling apparatus 100 according to Embodiment 2 can adjust the flow rate of the refrigerant circulating through the cooler 3 and the radiator 5 by opening or closing the flow rate control valve 11 or by adjusting the degree of opening of the flow rate control valve 11 when the flow rate cannot be controlled by the pump 1.

When the amount of heat generated in the electronic instrument 2 is low, the amount of evaporation of the refrigerant in the cooler 3 decreases, making drying out difficult even if the flow rate of the refrigerant is reduced. In the radiator 5, the higher the flow rate of the refrigerant, the smaller the difference in enthalpy between the refrigerant flowing in and the refrigerant flowing out. Thus, to increase the degree of supercooling of the refrigerant at the outlet of the radiator 5, it is better to reduce the flow rate of the refrigerant. Also in the vapor generation unit 10, the lower the flow rate of the refrigerant, the more the amount of input heat required to generate vapor can be reduced. Therefore, when the amount of heat generated in the electronic instrument 2 is low, it is better to reduce the flow rate of the refrigerant circulating through each instrument.

In FIG. 8, the bypass branched flow path 101 branches from the flow path between discharge from the pump 1 and inflow into the discharge-side heat exchanger 7, and joins the flow path between outflow from the suction-side heat exchanger 8 and suction into the pump 1. In this case, when the flow rate control valve 11 is opened, the flow rate of the refrigerant flowing through not only the cooler 3 and the radiator 5 but also the discharge-side heat exchanger 7 and the suction-side heat exchanger 8 is reduced.

As a result, the amount of heat required to reduce the degree of supercooling of the refrigerant in the discharge-side heat exchanger 7 and the amount of heat required to increase the degree of supercooling of the refrigerant in the suction-side heat exchanger 8 decrease, so that electric power consumption can be reduced by reducing the amount of heat exchanged by the Peltier device 9

In FIG. 9, the bypass branched flow path 101 branches from the flow path between discharge from the pump 1 and inflow into the discharge-side heat exchanger 7, and joins the flow path between outflow from the radiator 5 and inflow into the suction-side heat exchanger 8. In this case, when the flow rate control valve 11 is opened, the flow rate of the refrigerant flowing through not only the cooler 3 and the radiator 5 but also the discharge-side heat exchanger 7 is reduced.

Although the flow rate of the refrigerant flowing through the suction-side heat exchanger 8 does not decrease, the low-temperature refrigerant that has been cooled in the suction-side heat exchanger 8, passed through the pump 1, and branched to pass through the bypass branched flow path 101 where the flow rate control valve 11 is provided joins again the refrigerant flowing out from the radiator 5, and then flows into the suction-side heat exchanger 8. As a result, the refrigerant inside the suction-side heat exchanger 8 is maintained in a state at a lower temperature and with a higher degree of supercooling than the refrigerant flowing out from the radiator 5, so that dissipation of bubbles is facilitated. The dissipation of bubbles contained in the refrigerant that has flowed out from the radiator 5 is also facilitated by agitation in the flow when the refrigerant that has passed through the flow rate control valve 11 and the refrigerant that has flowed out from the radiator 5 join together. As a result, even under conditions where the amount of heat generated in the electronic instrument 2 is low but the radiation capacity of the radiation surface 4 is low, a boiling delay in the cooler 3 and inflow of bubbles into the pump 1 can be further suppressed.

In FIG. 10, the bypass branched flow path 101 branches from the flow path between outflow from the discharge-side heat exchanger 7 and inflow into the vapor generation unit 10 and joins the flow path between outflow from the suction-side heat exchanger 8 and suction into the pump 1. In this case, when the flow rate control valve 11 is opened, the flow rate of the refrigerant flowing through not only the cooler 3 and the radiator 5 but also the suction-side heat exchanger 8 is reduced.

This configuration may preferably be applied when the radiation capacity on the radiation surface 4 is too high and the temperature of the refrigerant flowing out from the radiator 5 is too low, for example. In this configuration, part of the refrigerant heated in and flowed out from the discharge-side heat exchanger 7 passes through the bypass branched flow path where the flow rate control valve 11 is provided, joins the refrigerant flowed out from the suction-side heat exchanger 8, and then flows into the pump 1. Therefore, the temperature of the refrigerant flowing into the pump 1 is higher than the temperature of the refrigerant flowing out from the suction-side heat exchanger 8, and the degree of supercooling also decreases. There may be a case where the radiation capacity on the radiation surface 4 is too high and the temperature of the refrigerant flowing out from the radiator 5 is a temperature close to the minimum allowable temperature of the pump 1 or the electronic instrument 2, or a temperature equal to or lower than the minimum allowable temperature. In this case, since the degree of supercooling of the refrigerant is increased in the suction-side heat exchanger 8 and then the refrigerant to flow into the pump 1 is heated by being joined by the high-temperature refrigerant, a failure or malfunction of the pump 1 due to falling below the minimum allowable temperature can be prevented. When bubbles contained in the refrigerant condense completely in the suction-side heat exchanger 8, the refrigerant needs to be heated to the saturation temperature or higher for bubbles to be generated again. Therefore, even if the high-temperature refrigerant joins from the bypass branched flow path 101 causing heating, bubbles will not flow into the pump 1.

If the degree of supercooling is high enough for bubbles to dissipate and the refrigerant at a lower temperature than the minimum allowable temperature of the pump 1 or the electronic instrument 2 flows out from the radiator 5, a reverse electric current may be passed through the Peltier device 9 to exchange heat so that the discharge-side heat exchanger 7 is cooled and the suction-side heat exchanger 8 is heated. In this case, by increasing the amount of heat to be applied in the vapor generation unit 10, it is possible to also prevent the refrigerant at or below the minimum allowable temperature of the electronic instrument 2 from flowing into the cooler 3 and causing a failure or malfunction of the electronic instrument 2.

The radiation capacity of the radiation surface 4 becomes too high in the artificial satellite 200 when, for example, the artificial satellite 200 is hidden in the shade of a planet for a long time and does not receive solar radiation. In this case, until the amount of heat supplied to the radiator 5 and the amount of heat released from the radiation surface 4 become equal through the refrigerant, the temperatures of the refrigerant and the radiation surface 4 continue to decease toward the temperature of deep space. Therefore, if the amount of heat generated in the electronic instrument 2 is low, the temperature of the refrigerant flowing out from the radiator 5 is prone to falling below the minimum allowable temperature of the pump 1 or the electronic instrument 2.

*Other Configurations*

<Variation 1 of Embodiment 2>

Figure 11:
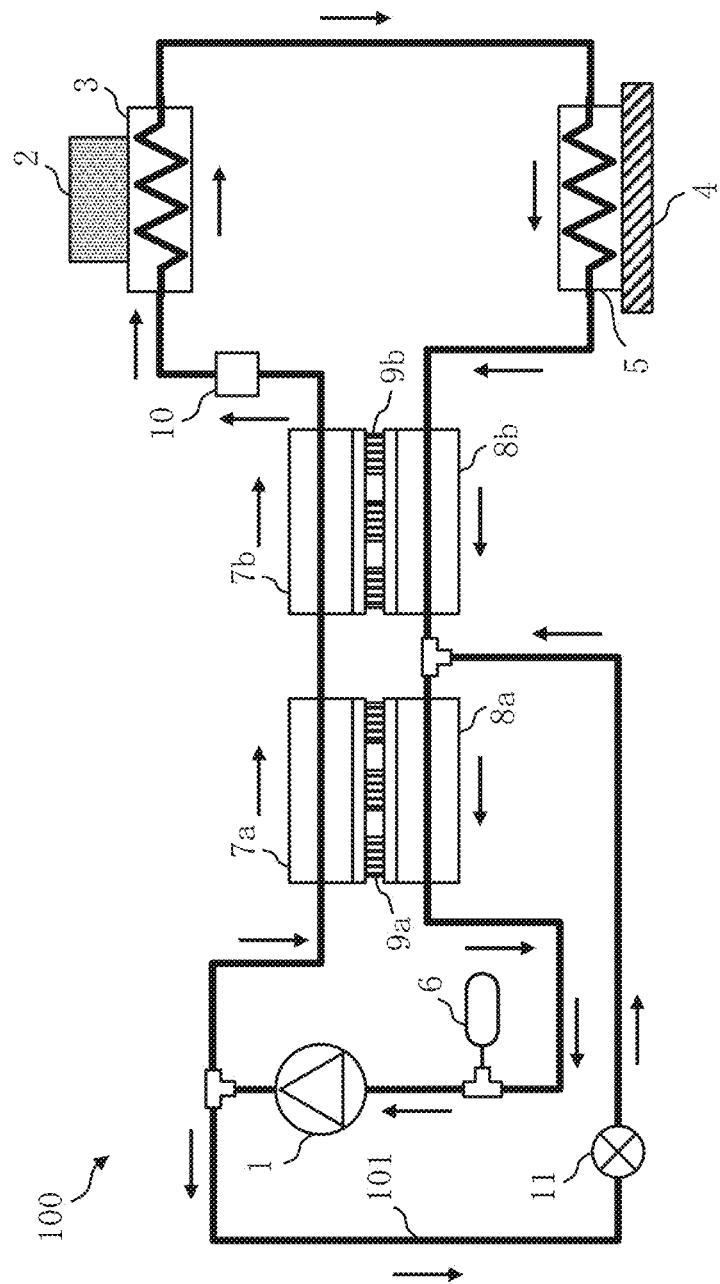
FIG. 11 is a refrigerant circuit diagram of the cooling apparatus 100 according to Variation 1 of Embodiment 2.
Figure 12:
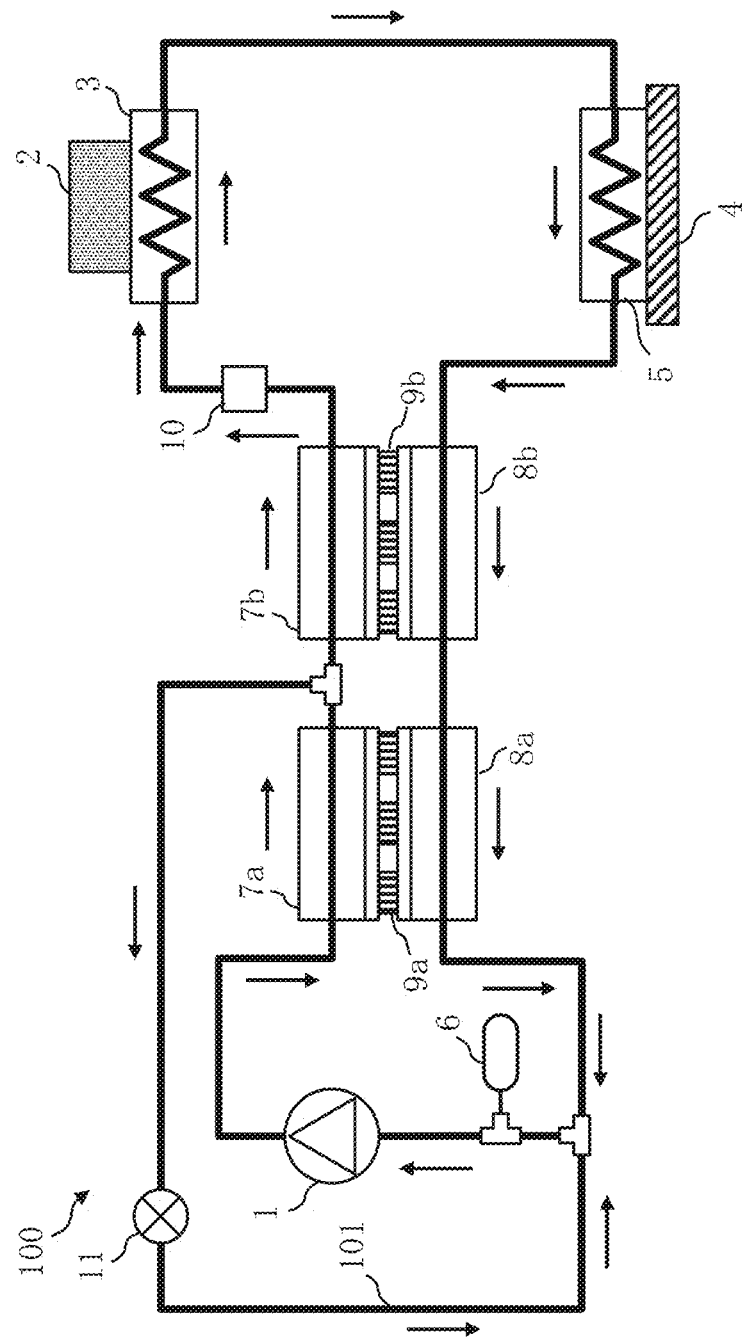
FIG. 12 is a refrigerant circuit diagram of the cooling apparatus 100 according to Variation 1 of Embodiment 2.

As illustrated in FIGS. 11 and 12, a plurality of sets of the discharge-side heat exchanger 7, the suction-side heat exchanger 8, and the Peltier device 9 may be used to realize the functions of the configurations illustrated in FIGS. 8 to 10 in combination.

In FIG. 11, the bypass branched flow path 101 branches from the flow path between discharge from the pump 1 and inflow into the first discharge-side heat exchanger 7a, and joins the flow path between outflow from the second suction-side heat exchanger 8b and inflow into the first suction-side heat exchanger 8a. In this case, it is possible to achieve both the functions in the case where the flow rate control valve 11 is provided in the bypass branched flow path 101 that branches from the flow path between discharge from the pump 1 and inflow into the discharge-side heat exchanger 7 and joins the flow path between outflow from the suction-side heat exchanger 8 and suction into the pump 1, as illustrated in FIG. 8, and the functions in the case where the flow rate control valve 11 is provided in the bypass branched flow path 101 that branches from the flow path between discharge from the pump 1 and inflow into the discharge-side heat exchanger 7 and joins the flow path between outflow from the radiator 5 and inflow into the suction-side heat exchanger 8, as illustrated in FIG. 9.

In the second discharge-side heat exchanger 7b and the second suction-side heat exchanger 8b that exchange heat on the high-temperature side, the flow rate decreases. Therefore, even if the electric power consumption of the second Peltier device 9b provided between them is reduced, the temperature changes easily in each of these heat exchangers.

As for the first discharge-side heat exchanger 7a and the first suction-side heat exchanger 8a that exchange heat on the low-temperature side, the low-temperature refrigerant cooled in the first suction-side heat exchanger 8a passes through the pump 1 and the flow rate control valve 11, joins again the refrigerant flowing through the flow path between the second suction-side heat exchanger 8b and the first suction-side heat exchanger 8a, and flows into the first suction-side heat exchanger 8a. Therefore, the temperature of the refrigerant flowing through the first suction-side heat exchanger 8a is lowered further to facilitate dissipation of bubbles. Furthermore, the dissipation of bubbles is also facilitated by agitation in the flow when the low-temperature refrigerant that has passed through the flow rate control valve 11 joins again the flow path between the second suction-side heat exchanger 8b and the first suction-side heat exchanger 8a.

That is, it is possible to reduce the electric power consumption of the cooling apparatus 100 and also further suppress a boiling delay in the cooler 3 and inflow of bubbles into the pump 1 when the amount of heat generated in the electronic instrument 2 is low. In particular, even under conditions where the radiation capacity of the radiation surface 4 is low, it is possible to reduce the electric power consumption of the cooling apparatus 100 and also further suppress a boiling delay in the cooler 3 and inflow of bubbles into the pump 1.

In FIG. 12, the bypass branched flow path 101 branches from the flow path between outflow from the first discharge-side heat exchanger 7a and inflow into the second discharge-side heat exchanger 7b, and joins the flow path between outflow from the first suction-side heat exchanger 8a and inflow into the pump 1. In this case, it is possible to realize both the functions of the case where the flow rate control valve 11 is provided in the bypass branched flow path 101 that branches from the flow path between discharge from the pump 1 and inflow into the discharge-side heat exchanger 7 and joins the flow path between outflow from the suction-side heat exchanger 8 and suction into the pump 1, as illustrated in FIG. 8, and the functions of the case where the flow rate control valve 11 is provided in the bypass branched flow path 101 that branches from the flow path between outflow from the discharge-side heat exchanger 7 and inflow into the vapor generation unit 10 and joins the flow path between outflow from the suction-side heat exchanger 8 and suction into the pump 1, as illustrated in FIG. 10.

In the second discharge-side heat exchanger 7b and the second suction-side heat exchanger 8b that exchange heat on the high-temperature side, the flow rate decreases. Therefore, even if the electric power consumption of the second Peltier device 9b provided between them is reduced, the temperature changes easily in each of these heat exchangers.

The first Peltier device 9a provided between the first discharge-side heat exchanger 7a and the first suction-side heat exchanger 8a on the low-temperature side is used mainly when the radiation capacity on the radiation surface 4 is too high and the temperature of the refrigerant flowing out from the radiator 5 is close to the minimum allowable temperature of the pump 1 or the electronic instrument 2, or is equal to or lower than the minimum allowable temperature. After the refrigerant is cooled in the first suction-side heat exchanger 8a to completely condense bubbles, the refrigerant heated by the first discharge-side heat exchanger 7a passes through the pump 1 and the flow rate control valve 11 and joins again the flow path between the first suction-side heat exchanger 8a and the pump 1. As a result, the temperature of the refrigerant to be sucked into the pump 1 rises again, and the temperature can be maintained at or above the minimum allowable temperature of the pump 1.

Alternatively, when the refrigerant is cooled in the second suction-side heat exchanger 8b and bubbles condense completely, a reverse electric current is passed through the first Peltier device 9a to heat the refrigerant flowing through the first suction-side heat exchanger 8a so that the refrigerant to be sucked into the pump 1 is heated. This can further prevent the refrigerant at or below the minimum allowable temperature from being sucked into the pump 1. In this case, the refrigerant cooled in the first discharge-side heat exchanger 7a by the first Peltier device 9a can be heated again in the second discharge-side heat exchanger 7b by the second Peltier device 9b. Therefore, the electric power consumption of the cooling apparatus 100 can be reduced.

That is, the cooling apparatus 100 can be operated stably so that the refrigerant does not fall below the minimum allowable temperatures of the pump 1 and the electronic instrument 2 while reducing the electric power consumption of the cooling apparatus 100 when the amount of heat generated in the electronic instrument 2 is low. In particular, even under conditions where the radiation capacity on the radiation surface 4 is too high, the cooling apparatus 100 can be operated stably so that the refrigerant does not fall below the minimum allowable temperatures of the pump 1 and the electronic instrument 2 while reducing the electric power consumption of the cooling apparatus 100.

In FIGS. 11 and 12, the configurations in which the set of the discharge-side heat exchanger 7, the suction-side heat exchanger 8, and the Peltier device 9 is divided into two sets have been described as examples, where each of these components is divided into the first discharge-side heat exchanger 7a and the second discharge-side heat exchanger 7b, the first suction-side heat exchanger 8a and the second suction-side heat exchanger 8b, and the first Peltier device 9a and the second Peltier device 9b. However, each of these components may be divided into three or more components and the components in each set may be placed side by side.

In this case, in the configuration illustrated in FIG. 11, the joint point of the bypass branched flow path 101 may be located in one of the flow paths connecting a plurality of suction-side heat exchangers 8. In the configuration illustrated in FIG. 12, the branch point to the bypass branched flow path 101 may be located in one of the flow paths connecting a plurality of discharge-side heat exchangers 7.

<Variation 2 of Embodiment 2>

Figure 13:
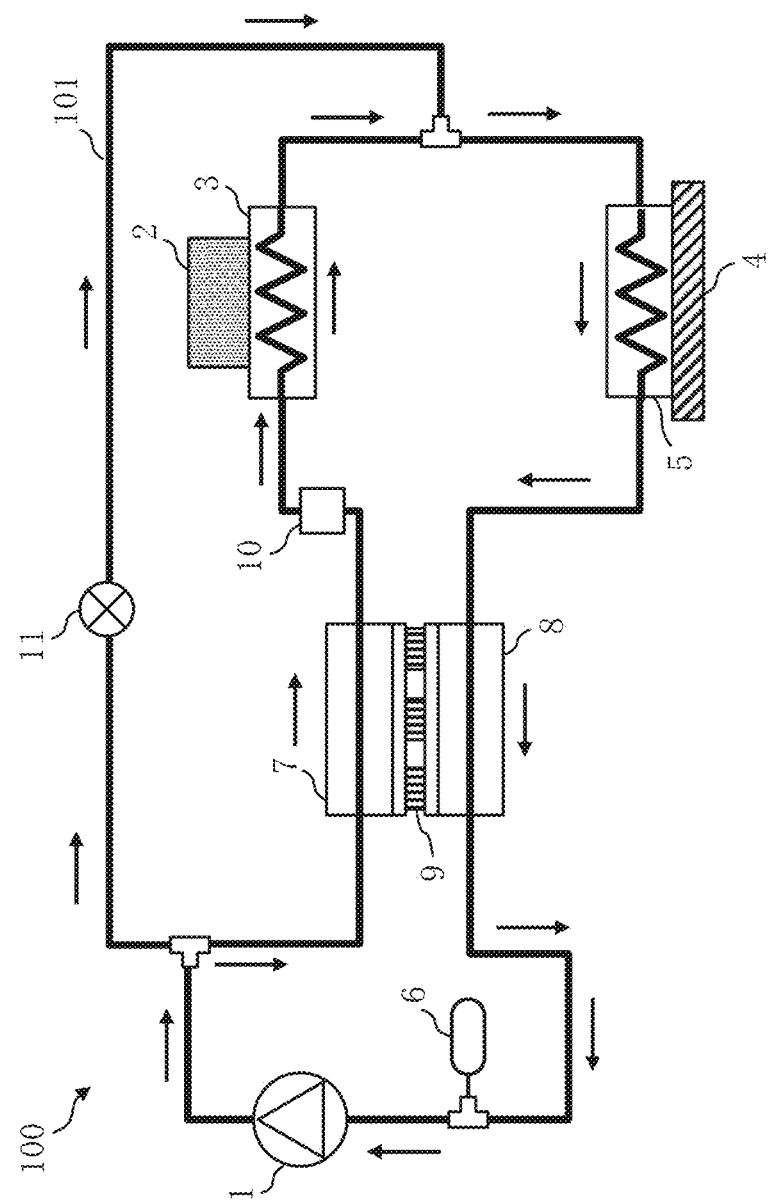
FIG. 13 is a refrigerant circuit diagram of the cooling apparatus 100 according to Variation 2 of Embodiment 2.

As illustrated in FIG. 13, the bypass branched flow path 101 may branch from the flow path from the pump 1 to the discharge-side heat exchanger 7 and join the flow path from the cooler 3 to the radiator 5.

Like the cooling apparatus 100 according to Embodiment 2 above, the cooling apparatus 100 according to Variation 2 of Embodiment 2 opens the flow rate control valve 11 to reduce the flow rate of the refrigerant circulating through the vapor generation unit 10 and the cooler 3 when the amount of heat generated in the electronic instrument 2 is low. However, a difference is that the flow rate of the refrigerant flowing through the radiator 5 does not decrease.

Since the flow speed in the radiator 5 does not decrease, the heat transfer coefficient is kept high and the radiation capacity of the radiator 5 can be kept high. In addition, condensation of the gas phase is promoted by agitation in the flow w % ben the low-temperature refrigerant that has been cooled in the suction-side heat exchanger 8 and passed through the pump 1 and the flow rate control valve 11 joins the high-temperature gas-liquid two-phase flow flowing through the flow path from the cooler 3 to the radiator 5. This can speed up dissipation of bubbles in the radiator 5 or the suction-side heat exchanger 8.

Embodiment 3

Embodiment 3 differs from Embodiments 1 and 2 in that at least one of the discharge-side heat exchanger 7 and the suction-side heat exchanger 8 is provided in a branch flow path branched from the refrigerant flow path. In Embodiment 3, this difference will be described and description of the same aspects will be omitted.

In Embodiment 3, an example in which the configuration of Embodiment 1 is changed will be described.

*Description of Configurations*

Referring to FIGS. 14 to 18, configurations of the cooling apparatus 100 according to Embodiment 3 will be described.

In FIGS. 14 to 18, solid arrows indicate the main flow direction of the refrigerant, and dashed arrows indicate a branch flow direction of the refrigerant.

In the cooling apparatus 100 according to Embodiment 3, at least one of the discharge-side heat exchanger 7 and the suction-side heat exchanger 8 is provided in a branch flow path that branches from the refrigerant flow path and provided in parallel with the refrigerant flow path.

Figure 14:
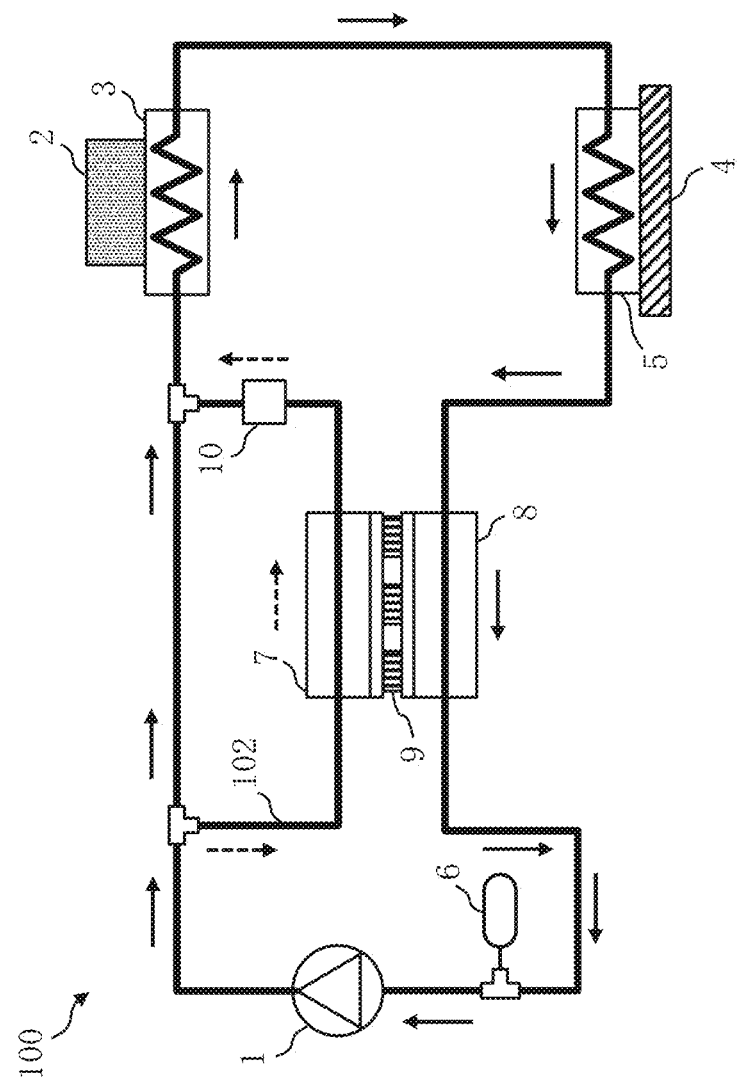
FIG. 14 is a refrigerant circuit diagram of the cooling apparatus 100 according to Embodiment 3.
Figure 15:
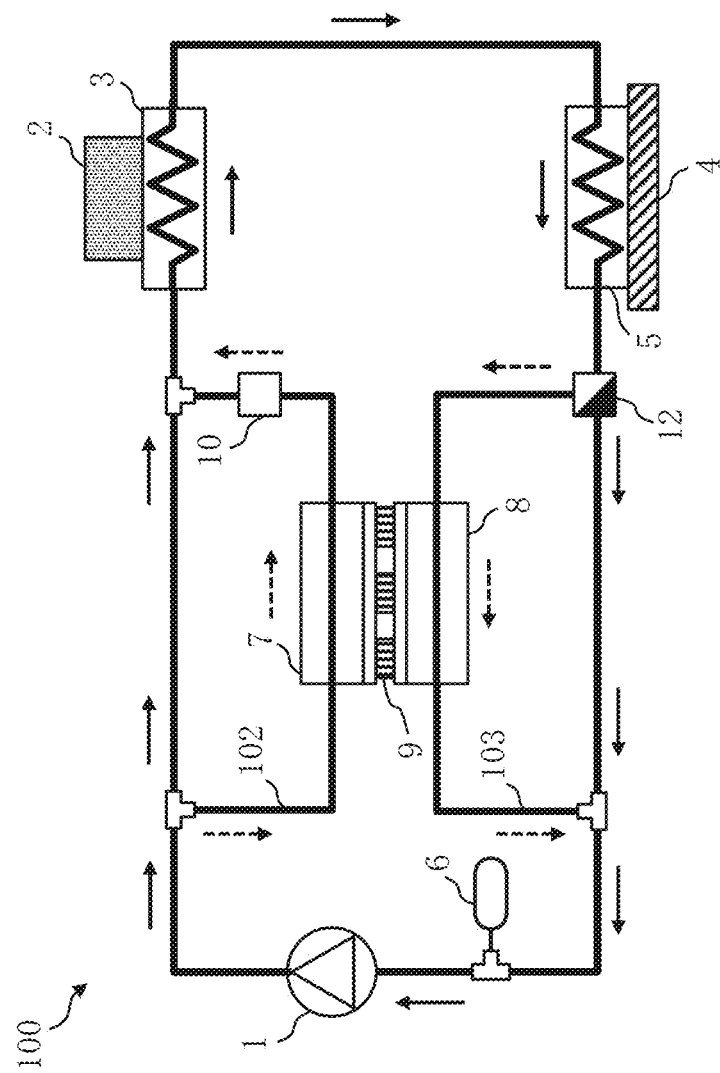
FIG. 15 is a refrigerant circuit diagram of the cooling apparatus 100 according to Embodiment 3.

As a specific configuration, the cooling apparatus 100 according to Embodiment 3 may be configured as illustrated in FIG. 14 or FIG. 15.

In FIG. 14, the cooling apparatus 100 includes a first branch flow path 102 that branches from the flow path from the pump 1 to the cooler 3 in the refrigerant flow path and, joins the flow path from the pump 1 to the cooler 3 in the refrigerant flow path. The discharge-side heat exchanger 7 is provided in the first branch flow path 102.

When a plurality of discharge-side heat exchangers 7 are connected sequentially and when a branch point to the bypass branched flow path 101 is located on the upstream side or the downstream side as described in Embodiment 2, a plurality of first branch flow paths 102 may be provided so that the refrigerant flow path is branched immediately before inflow into each of the discharge-side heat exchangers 7 and the branched flow paths join the refrigerant flow path immediately after the inflow.

In FIG. 15, the cooling apparatus 100 includes a second branch flow path 103 that branches from the flow path from the radiator 5 to the pump 1 in the refrigerant flow path, and joins the flow path from the radiator 5 to the pump 1 in the refrigerant flow path. The suction-side heat exchanger 8 is provided in the second branch flow path 103. In particular, in FIG. 15 in the flow path from the radiator to the pump in the refrigerant flow path, a gas-liquid separator 12 is provided which is configured so that there is a difference in the distribution ratio of the gas phase and the liquid phase of the refrigerant flowing out to each flow path. The second branch flow path 103 connects a gas-phase outflow unit of the gas-liquid separator 12 and the flow path from the gas-liquid separator 12 to the pump 1 in the refrigerant flow path.

When a plurality of suction-side heat exchangers 8 are connected sequentially and when a joint point from the bypass branched flow path 101 is located on the upstream side or the downstream side as described in Embodiment 2, a plurality of second branch flow paths 103 may be provided so that the refrigerant flow path is branched immediately before inflow into each of the suction-side heat exchangers 8 and the branched flow paths join the refrigerant flow path immediately after the inflow.

FIG. 15 illustrates a configuration in which not only the suction-side heat exchanger 8 is provided in the branch flow path, but also the discharge-side heat exchanger 7 is provided in the first branch flow path 102 that branches from the refrigerant flow path in parallel and joins the refrigerant flow path again. However, when the suction-side heat exchanger 8 is provided in the second branch flow path 103, the discharge-side heat exchanger 7 does not necessarily need to be provided in the first branch flow path 102. When the suction-side heat exchanger 8 is provided in the second branch flow path 103, the discharge-side heat exchanger 7 may be provided in the refrigerant flow path.

Figure 16:
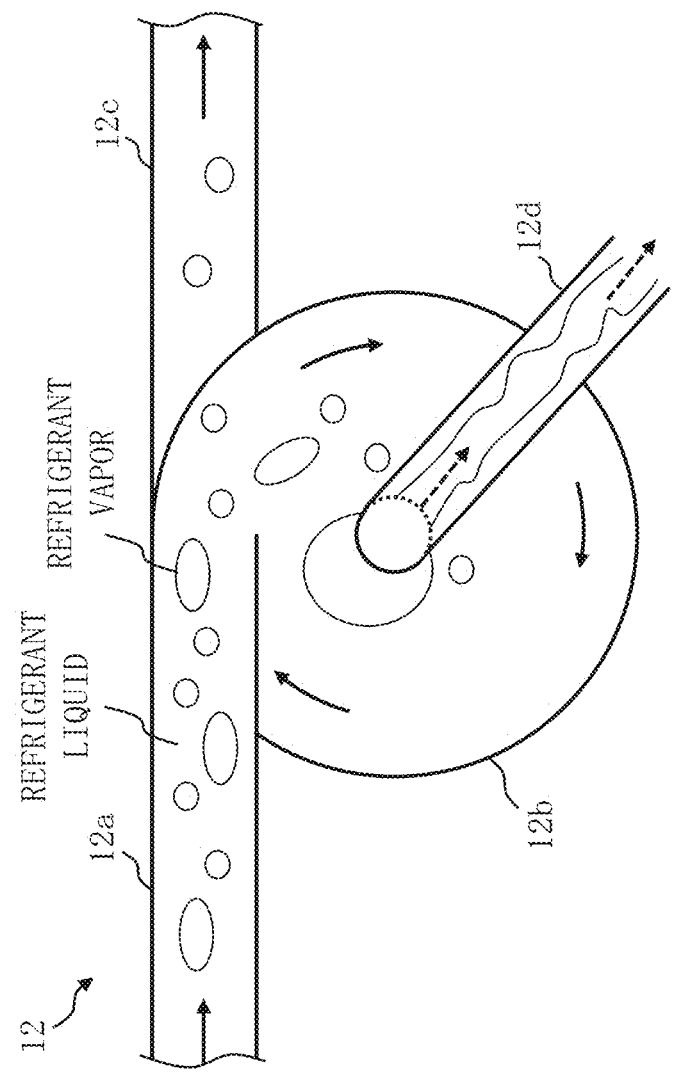
FIG. 16 is a diagram illustrating a structural example of a gas-liquid separator 12 according to Embodiment 3.

As illustrated in FIG. 16, the gas-liquid separator 12 includes a gas-liquid two-phase inflow unit 12a, a separation unit 12b, a liquid-phase outflow unit 12c, and a gas-phase outflow unit 12d. The gas-liquid two-phase inflow unit 12a is a flow path into which the gas-liquid two-phase refrigerant flows. The separation unit 12b separates the gas-liquid two-phase refrigerant that has flowed in from the gas-liquid two-phase inflow unit 12a into the refrigerant with a high liquid-phase proportion and the refrigerant with a high gas-phase proportion. The liquid-phase outflow unit 12c is a flow path from which the refrigerant with a high liquid-phase proportion flows out. The gas-phase outflow unit 12d is a flow path from which the refrigerant with a high gas-phase proportion flows out. The liquid-phase outflow unit 12c with a high liquid-phase proportion is connected to the refrigerant flow path, and the gas-phase outflow unit 12d with a high gas-phase proportion is connected to the second branch flow path 103 where the suction-side heat exchanger 8 is provided.

<Configuration of the Gas-Liquid Separator 12>

In a structural example illustrated in FIG. 16, the separation unit 12b has a cylindrical structure. The gas-liquid two-phase refrigerant that has flowed in from the gas-liquid two-phase inflow unit 12a swirls in the separation unit 12b. At this time, the swirling generates centrifugal force, and the liquid phase with high specific gravity gathers on a cylinder wall side in the separation unit 12b, and the gas phase with low specific gravity gathers on a cylinder center side in the separation unit 12b. As a result, the refrigerant flowing through the liquid-phase outflow unit 12c connected with the cylinder wall of the separation unit 12b is the refrigerant with a high liquid-phase proportion, and the refrigerant flowing through the gas-phase outflow unit 12d connected with the cylinder center of the separation unit 12b is the refrigerant with a high gas-phase proportion.

Figure 17:
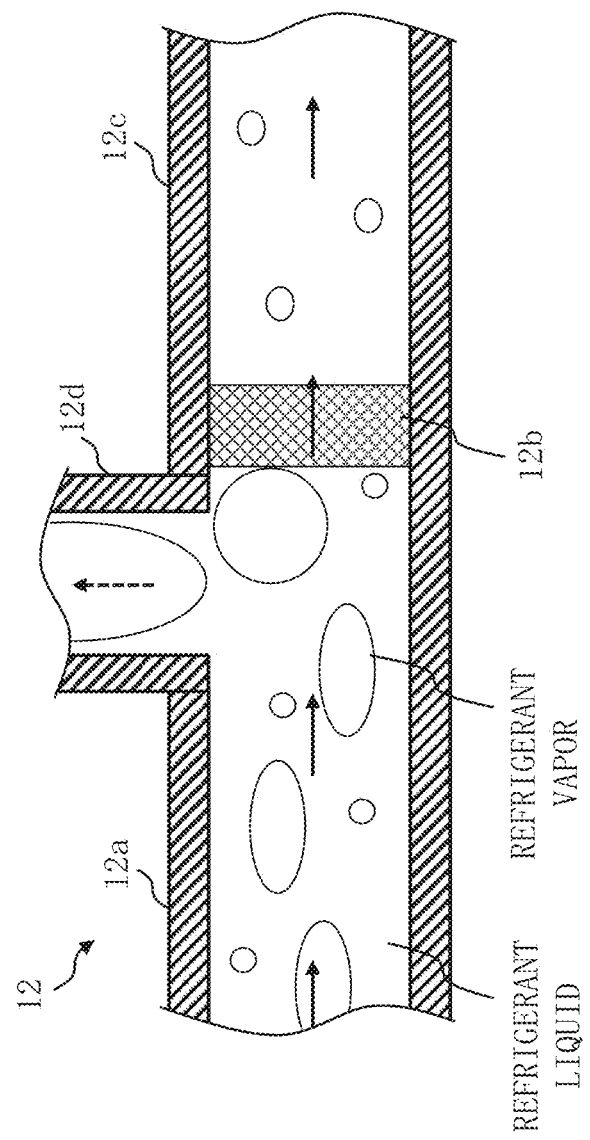
FIG. 17 is a diagram illustrating a structural example of the gas-liquid separator 12 according to Embodiment 3.

In a structural example of the gas-liquid separator 12 illustrated in FIG. 17, the separation unit 12b has a filter structure made of a porous material with voids, mesh, fiber, or the like. That is, the separation unit 12b is made of a material that does not allow the gas phase to pass through easily, and allows the liquid phase to pass through easily. In order to flow from the gas-liquid two-phase inflow unit 12a to the liquid-phase outflow unit 12c, the refrigerant needs to pass through the separation unit 12b. On the other hand, the refrigerant can flow from the gas-liquid two-phase inflow unit 12a to the gas-phase outflow unit 12d without passing through the separation unit 12b.

The separation unit 12b is difficult to pass through for a gas-phase portion and easy to pass through for a liquid-phase portion of the gas-liquid two-phase refrigerant that has flowed in from the gas-liquid two-phase inflow unit 12a. Therefore, the refrigerant flowing through the liquid-phase outflow unit 12c is the refrigerant with a high liquid-phase proportion, and the refrigerant flowing through the gas-phase outflow unit 12d is the refrigerant with a high gas-phase proportion.

Figure 18:
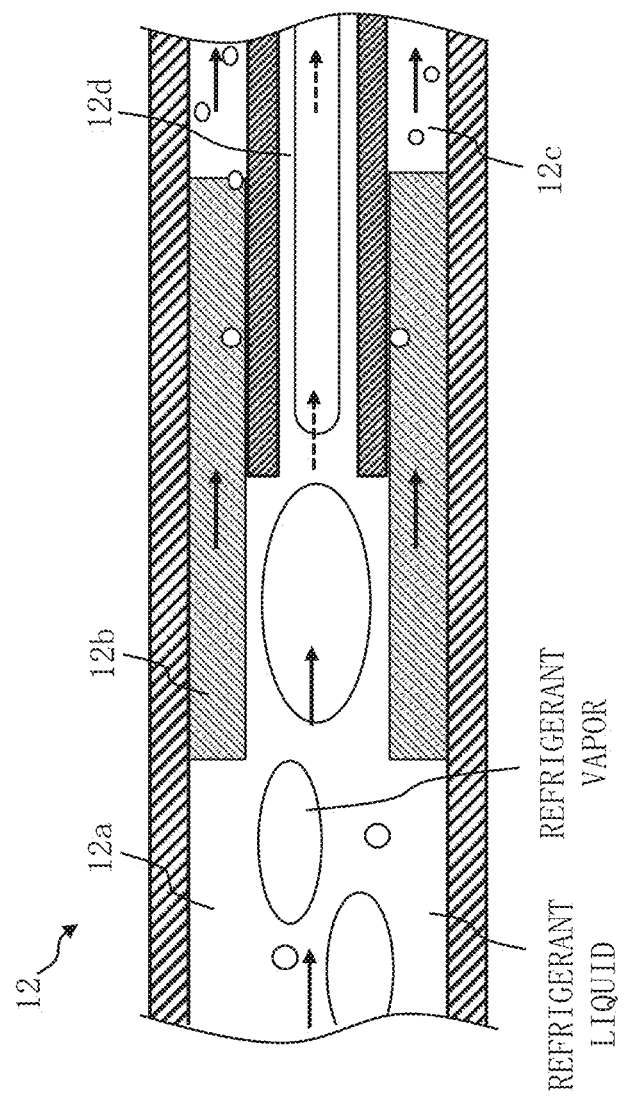
FIG. 18 is a diagram illustrating a structural example of the gas-liquid separator 12 according to Embodiment 3.

In a structural example of the gas-liquid separator 12 illustrated in FIG. 18, the gas-liquid separator 12 has a double pipe structure. The separation unit 12b is composed of a groove provided on an outer pipe wall. The liquid-phase outflow unit 12c is a space in contact with the separation unit 12b between an outer pipe and an inner pipe. The gas-phase outflow unit 12d is a space inside the inner pipe inside the separation unit 12b. The groove constituting the separation unit 12b is formed with pits and projections in the cross section of the pipe along the outer wall surface. When the gas-liquid two-phase refrigerant flows into the separation unit 12b, the liquid-phase refrigerant gathers in the pits of the groove due to surface tension. Therefore, the gas-phase refrigerant mainly flows in the center of the outer pipe of the gas-liquid separator 12, and the liquid-phase refrigerant mainly flows on the outer pipe wall side. As a result, the refrigerant flowing through the liquid-phase outflow unit 12c located in the space between the outer pipe and the inner pipe is the refrigerant with a high liquid-phase proportion, and the refrigerant flowing through the gas-phase outflow unit 12d inside the inner pipe is the refrigerant with a high gas-phase proportion.

*Description of Operation*

In the cooling apparatus 100 according to Embodiment 3, at least one of the discharge-side heat exchanger 7 and the suction-side heat exchanger 8 is provided in the branch flow path instead of the refrigerant flow path connecting the components of the cooling apparatus 100. Therefore, only part of the refrigerant branching to and flowing through the branch flow path, out of the refrigerant circulating in the refrigerant flow path, flows into at least one of the discharge-side heat exchanger 7 and the suction-side heat exchanger 8. That is, the flow rate of the refrigerant flowing though the discharge-side heat exchanger 7 or the suction-side heat exchanger 8 provided in the branch flow path is reduced. Therefore, a change in enthalpy and a change in temperature between the inflow and outflow become large with a small amount of heat exchange.

*Effects of Embodiment 3*

In the cooling apparatus 100 according to Embodiment 3, when the discharge-side heat exchanger 7 is provided in the first branch flow path 102 that branches from the refrigerant flow path, the flow rate of the refrigerant flowing through the discharge-side heat exchanger 7 is reduced. As a result, compared to when it is provided in the refrigerant flow path, a rise in the enthalpy and temperature of the refrigerant flowing through the first branch flow path 102 after flowing out from the discharge-side heat exchanger 7 increases with a small amount of heat exchange.

Even if the electric power consumption of the Peltier device 9 is further reduced, the enthalpy of the refrigerant flowing through the first branch flow path 102 after flowing out from the discharge-side heat exchanger 7 can be raised to the saturation condensation enthalpy or higher so as to generate bubbles. When joining the refrigerant flow path, the bubbles generated in the first branch flow path 102 are mixed with the supercooled refrigerant liquid flowing through the refrigerant flow path and condense partly. However, if some of the bubbles remain, generation of vapor in the vapor generation unit 10 is facilitated and the electric power consumption of the vapor generation unit 10 can be reduced. Furthermore, if many of the bubbles remain after flowing out from the discharge-side heat exchanger 7 and joining the refrigerant flow path, evaporation of the refrigerant liquid in the cooler 3 can be promoted and uneven cooling in the electronic instrument 2 due to a boiling delay can be suppressed without using the vapor generation unit 10.

In the cooling apparatus 100 according to Embodiment 3, when the suction-side heat exchanger 8 is provided in the second branch flow path 103 that branches from the refrigerant flow path, the flow rate of the refrigerant flowing through the suction-side heat exchanger 8 is reduced. As a result, compared to when it is provided in the refrigerant flow path, a decrease in the enthalpy and temperature of the refrigerant flowing through the second branch flow path 103 after flowing out from the suction-side heat exchanger 8 increases with a small amount of heat exchange.

In the second branch flow path 103 after flowing out from the suction-side heat exchanger 8, the degree of supercooling of the refrigerant is high and condensation of bubbles is facilitated. The refrigerant is agitated when joining the refrigerant flow path after flowing out from the suction-side heat exchanger 8, facilitating condensation of remaining bubbles. At the branch point to the second branch flow path 103, if the refrigerant with a high gas-phase proportion is steered in the gas-liquid separator 12 to flow into the suction-side heat exchanger 8 in the branch flow path, the gas phase can be intensively cooled in the suction-side heat exchanger 8, so that condensation of bubbles is further facilitated.

FIG. 15 illustrates the cooling apparatus 100 in which both of the discharge-side heat exchanger 7 and the suction-side heat exchanger 8 are provided in the branch flow paths instead of the refrigerant flow path. In this configuration, by adjusting the flow rates in the discharge-side heat exchanger 7 and the suction-side heat exchanger 8 to be roughly the same, a difference in the temperatures at the both end faces of the Peltier device 9 provided between the discharge-side heat exchanger 7 and the suction-side heat exchanger 8 becomes small. Therefore, even if the electric power consumption of the Peltier device 9 is reduced, the amount of heat exchange increases and the amount of change in enthalpy and temperature between the inflow and outflow of each of the discharge-side heat exchanger 7 and the suction-side heat exchanger 8 increases further.

Even when evaporation has started on the outflow side of the discharge-side heat exchanger 7, if the refrigerant with a high gas-phase proportion flows into the suction-side heat exchanger 8 via the gas-liquid separator 12, the temperatures at both the outflow side of the discharge-side heat exchanger 7 and the inflow side of the suction-side heat exchanger 8 approach the saturation vapor temperature, and a difference in the temperatures of the both end faces of the Peltier device 9 between them is reduced.

With the gas-liquid separator 12 illustrated in any one of FIGS. 16 to 18, gas-liquid separation is possible without using gravity. Therefore, it can be applied even in a zero gravity or microgravity environment in outer space.

Embodiment 4

Embodiment 4 differs from Embodiments 1 to 3 in that a two-phase region heat exchanger 13 is provided in the flow path from the cooler 3 to the radiator 5 in the refrigerant flow path and the second Peltier device 9b is provided between the discharge-side heat exchanger 7 and the two-phase region heat exchanger 13. In Embodiment 4, this difference will be described and description of the same aspects will be omitted.

In Embodiment 4, an example in which the configuration of Embodiment 1 is changed will be described.

*Description of Configurations*

Figure 19:
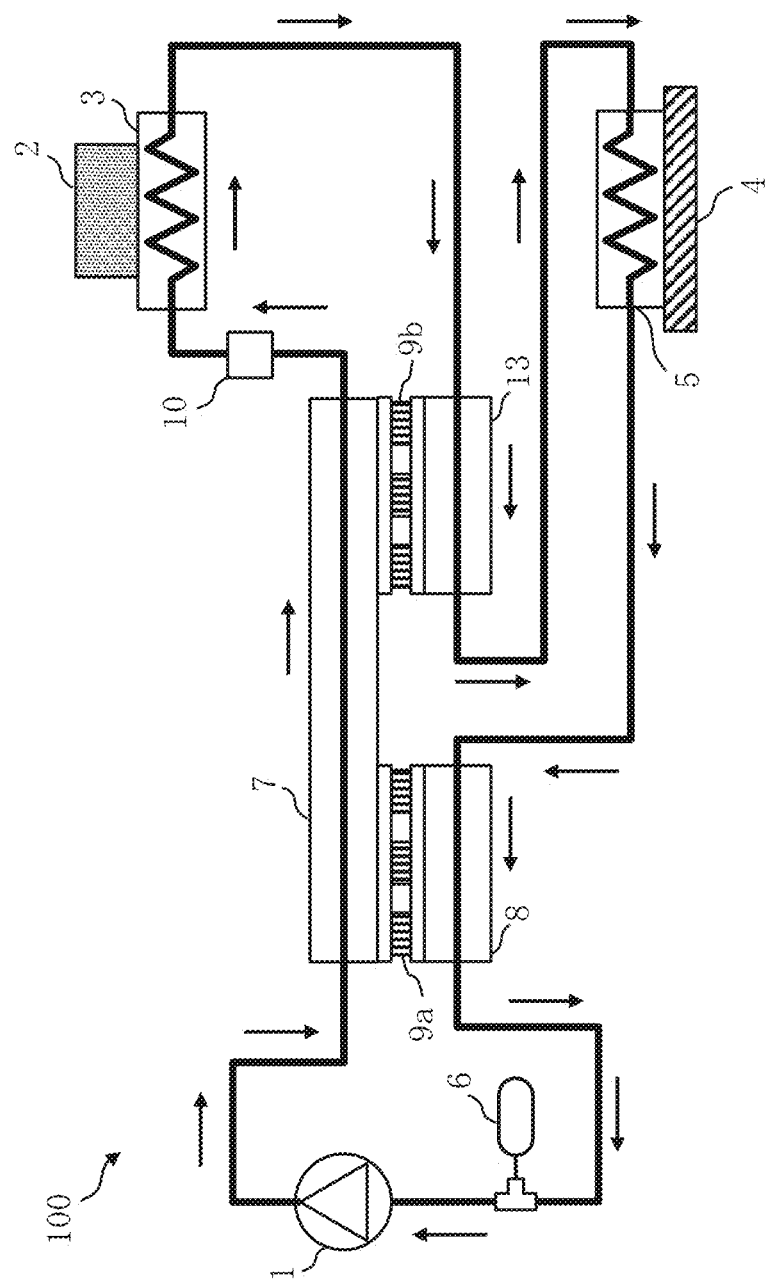
FIG. 19 is a refrigerant circuit diagram of the cooling apparatus 100 according to Embodiment 4.
Figure 20:
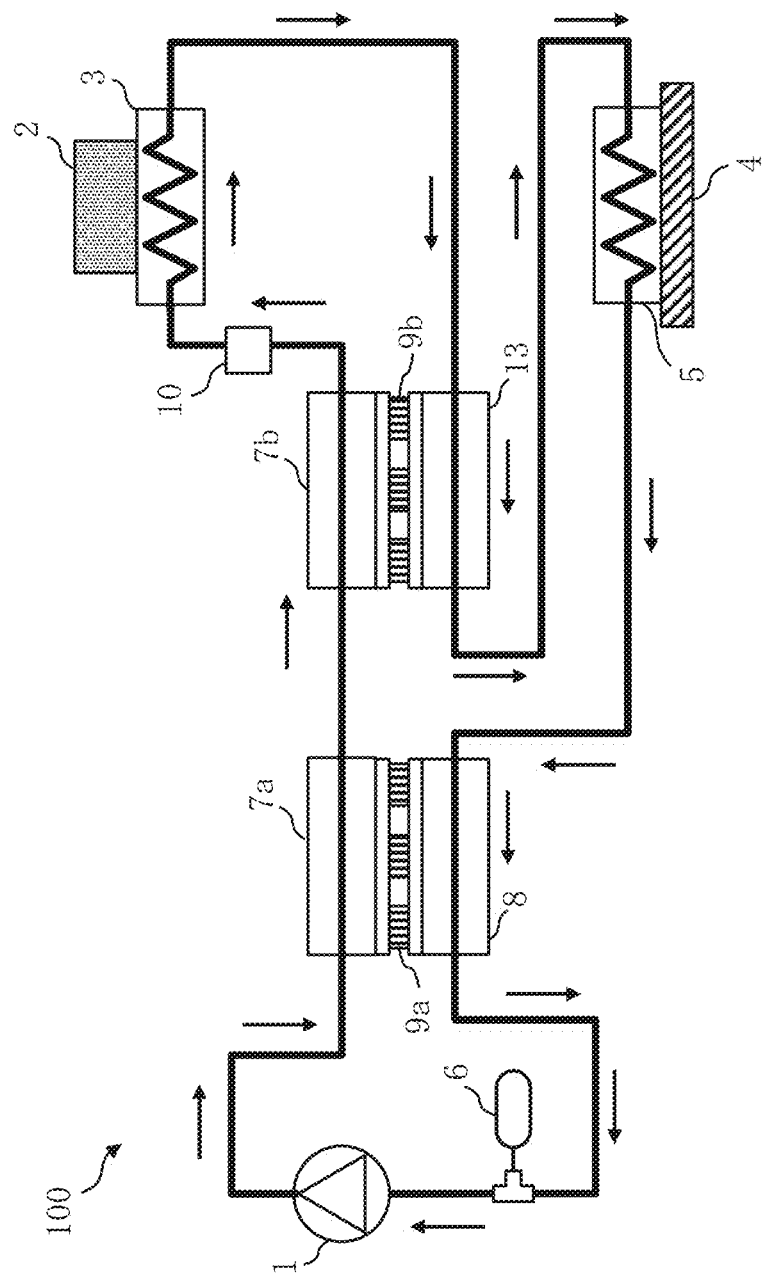
FIG. 20 is a refrigerant circuit diagram of the cooling apparatus 100 according to Embodiment 4.
Figure 21:
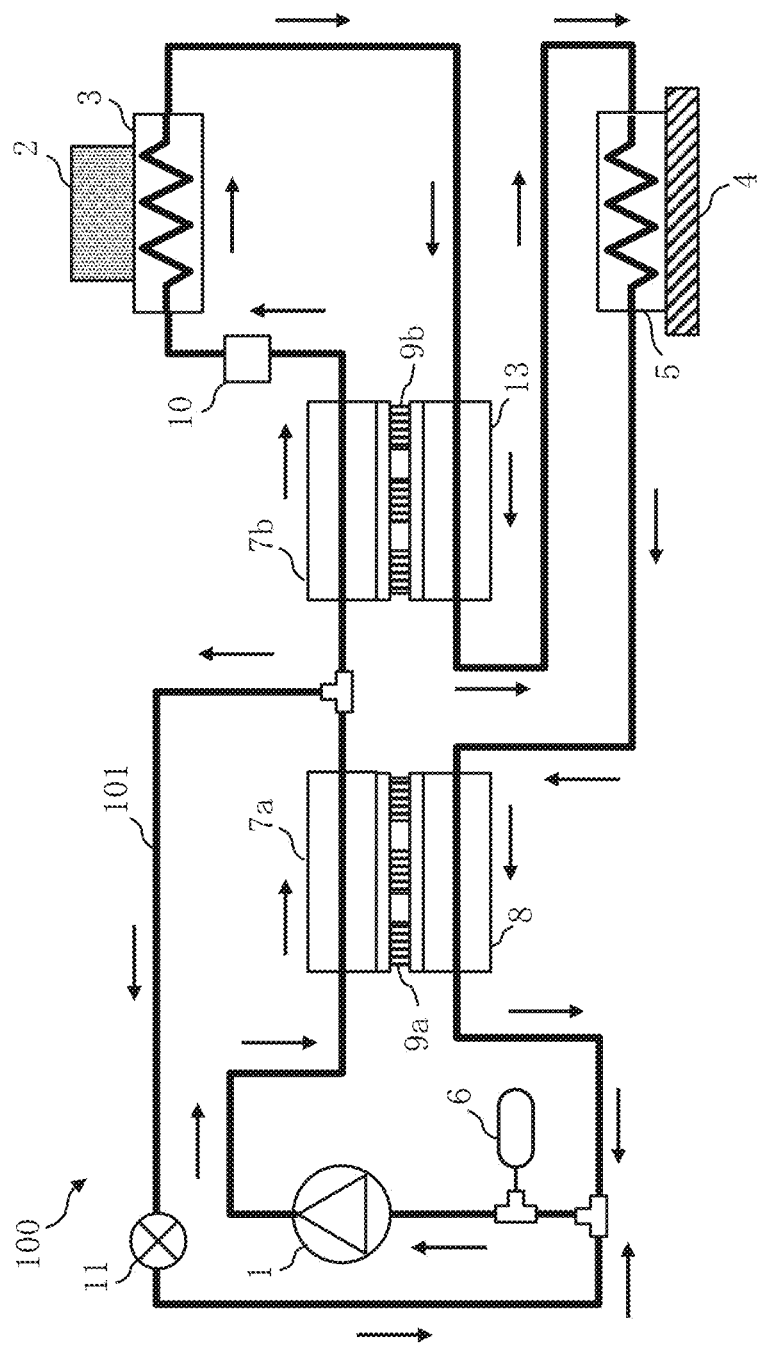
FIG. 21 is a refrigerant circuit diagram of the cooling apparatus 100 according to Embodiment 4.

Referring to FIGS. 19 to 21, configurations of the cooling apparatus 100 according to Embodiment 4 will be described.

In FIGS. 19 to 21, solid arrows indicate the main flow direction of the refrigerant.

The cooling apparatus 100 according to Embodiment 4 includes the two-phase region heat exchanger 13 in the refrigerant flow path from the cooler 3 to the radiator 5 in the refrigerant flow path, and the second Peltier device 9b is provided to be sandwiched between the downstream side of the discharge-side heat exchanger 7 and the two-phase region heat exchanger 13. The discharge-side heat exchanger 7 and the two-phase region heat exchanger 13 are placed facing each other so that the flows of the refrigerant inside are countercurrent to each other and heat is exchanged via the second Peltier device 9b between them.

As a specific configuration, the cooling apparatus 100 according to Embodiment 4 can be configured as illustrated in any one of FIGS. 19 to 21.

In FIG. 19, the first Peltier device 9a is provided to be sandwiched between the upstream side of the discharge-side heat exchanger 7 and the suction-side heat exchanger 8. The second Peltier device 9b is provided to be sandwiched between the downstream side of the discharge-side heat exchanger 7 and the two-phase region heat exchanger 13.

That is, the upstream side of the discharge-side heat exchanger 7, where the temperature is low, is placed to exchange heat with the suction-side heat exchanger 8, and the downstream side of the discharge-side heat exchanger 7, where the temperature is high, is placed to exchange heat with the two-phase region heat exchanger 13.

In FIG. 20, the discharge-side heat exchanger 7 is divided into the first discharge-side heat exchanger 7a and the second discharge-side heat exchanger 7b. The first Peltier device 9a is provided to be sandwiched between the first discharge-side heat exchanger 7a on the upstream side and the suction-side heat exchanger 8, and the second Peltier device 9b is provided to be sandwiched between the second discharge-side heat exchanger 7b on the downstream side and the two-phase region heat exchanger 13.

As in the configuration illustrated in FIG. 19, the upstream side of the discharge-side heat exchanger 7, where the temperature is low, is placed to exchange heat with the suction-side heat exchanger 8, and the downstream side of the discharge-side heat exchanger 7, where the temperature is high, is placed to exchange heat with the two-phase region heat exchanger 13.

In FIG. 21, the cooling apparatus 100 includes the bypass branched flow path 101 that branches from the flow path from the pump 1 to the cooler 3. The bypass branched flow path 101 branches from a point between the first discharge-side heat exchanger 7a and the second discharge-side heat exchanger 7b in the refrigerant flow path and joins the refrigerant flow path at a point between the suction-side heat exchanger 8 and the pump 1. The second Peltier device 9b is provided to be sandwiched between the second discharge-side heat exchanger 7b located downstream of the branch point of the bypass branched flow path 101 and the two-phase region heat exchanger 13.

As in the configurations illustrated in FIGS. 19 and 20, the upstream side of the discharge-side heat exchanger 7, where the temperature is low, is placed to exchange heat with the suction-side heat exchanger 8, and the downstream side of the discharge-side heat exchanger 7, where the temperature is high, is placed to exchange heat with the two-phase region heat exchanger 13.

\*\*\*Description of Operation\*\*\*

The refrigerant liquid discharged from the pump 1 is heated to almost the saturation vapor temperature by exchanging heat via the first Peltier device 9a with the refrigerant flowing through the suction-side heat exchanger 8. Then, the refrigerant heated to almost the saturation vapor temperature receives heat via the second Peltier device 9b from the gas-liquid two-phase refrigerant flowing through the two-phase region heat exchanger 13 and is heated to around the saturation vapor temperature. At this time, the gas-liquid two-phase refrigerant flowing through the two-phase region heat exchanger 13 is cooled by the second Peltier device 9b.

\*\*\*Effects of Embodiment 4\*\*\*

Since the temperature of the refrigerant flowing out from the discharge-side heat exchanger 7 needs to be raised to around the saturation vapor temperature, the temperature of the refrigerant flowing through the downstream side of the discharge-side heat exchanger 7 and the temperature of the gas-liquid two-phase refrigerant flowing through the flow path from the cooler 3 to the radiator 5 become close. Thus, if heat is exchanged between the downstream side of the discharge-side heat exchanger 7 and the two-phase region heat exchanger 13 via the second Peltier device 9b, a difference in the temperatures of the both end faces of the second Peltier device 9b becomes small. Therefore, even when the electric power consumption of the second Peltier device 9b is reduced, it is possible to easily heat the refrigerant flowing through the discharge-side heat exchanger 7 and cool the refrigerant flowing through the two-phase region heat exchanger 13.

The temperature of the end face the second Peltier device 9b on the side of the discharge-side heat exchanger 7 can be raised to or above the saturation vapor temperature of the refrigerant. Thus, it is also possible to heat the refrigerant flowing on the downstream side of the discharge-side heat exchanger 7 to cause the enthalpy to be higher than the saturation condensation enthalpy. Therefore, generation of vapor bubbles can be promoted on the downstream side of the discharge-side heat exchanger 7 or after outflow from the discharge-side heat exchanger 7.

The temperature of the gas-liquid two-phase refrigerant flowing through the two-phase region heat exchanger 13 is higher than the temperature of the supercooled refrigerant flowing through the suction-side heat exchanger 8. Thus, the supercooled refrigerant flowing through the discharge-side heat exchanger 7 can also be heated to almost the saturation vapor temperature by heat exchange due to heat transfer in the second Peltier device 9b without applying electric power to the second Peltier device 9b.

That is, the heat generated in the electronic instrument 2 is received by the refrigerant in the cooler 3, and is then returned in the two-phase region heat exchanger 13 via the second Peltier device 9b to the refrigerant flowing through the discharge-side heat exchanger 7 located on the upstream side of the cooler 3 so as to be utilized for facilitating evaporation. Therefore, the electric power consumption for heating the supercooled refrigerant in the discharge-side heat exchanger 7 can be further reduced.

Furthermore, cooling the gas-liquid two-phase refrigerant in the two-phase region heat exchanger 13 reduces the gas-phase proportion of the refrigerant flowing out from the two-phase region heat exchanger 13. Thus, the pressure loss in the refrigerant flow path up to the cooler 3 is reduced. The gas-liquid two-phase refrigerant flow path from the cooler 3 to the radiator 5 is the flow path where the greatest pressure loss tends to occur in the cooling apparatus 100. Therefore, reducing the pressure loss in this flow path reduces the load on the pump 1, so that the electric power consumption can be further reduced.

In FIG. 20, the discharge-side heat exchanger 7 is divided into the first discharge-side heat exchanger 7a and the second discharge-side heat exchanger 7b from upstream to downstream. In this case, heat transfer due to solid-state heat transmission between the first discharge-side heat exchanger 7a on the low-temperature side and the second discharge-side heat exchanger 7b on the high-temperature side is suppressed. Therefore, heat can be exchanged efficiently in each temperature zone.

In FIG. 21, the bypass branched flow path 101 is provided which branches from the refrigerant flow path between the first discharge-side heat exchanger 7a and the second discharge-side heat exchanger 7b and joins the refrigerant flow path on the suction side of the pump 1. There may be a case where the radiation capacity on the radiation surface 4 is too high, resulting in a condition where the temperature of the refrigerant flowing out from the radiator 5 is close to or at or below the minimum allowable temperature of the pump 1 or the electronic instrument 2. In this case, a reverse electric current can be applied to the first Peltier device 9a to heat the refrigerant liquid flowing through the suction-side heat exchanger 8 so as to prevent the temperature of the pump 1 located downstream from dropping below the minimum allowable temperature. In this way, even when the supercooled liquid is further cooled in the first discharge-side heat exchanger 7a, the refrigerant flowing through the second discharge-side heat exchanger 7b can be heated more efficiently to around the saturation vapor temperature by exchanging heat via the second Peltier device 9b with the high-temperature gas-liquid two-phase refrigerant flowing through the two-phase region heat exchanger 13.

\*\*\*Other Configurations\*\*\*

<Variation 1 of Embodiment 4>

Figure 22:
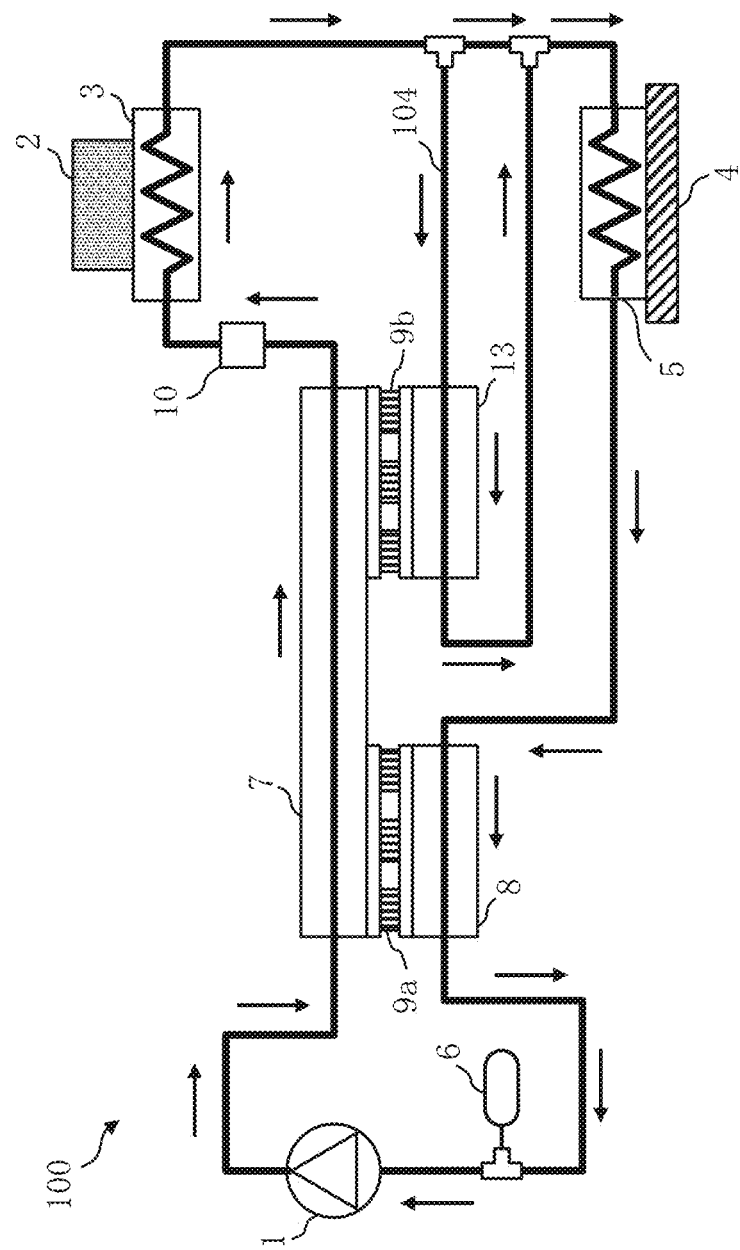
FIG. 22 is a refrigerant circuit diagram of the cooling apparatus 100 according to Variation 1 of Embodiment 4.

As illustrated in FIG. 22, the cooling apparatus 100 includes a third branch flow path 104 that branches from the flow path from the cooler 3 to the radiator 5 in the refrigerant flow path and joins the flow path from the cooler 3 to the radiator 5 in the refrigerant flow path. The two-phase region heat exchanger 13 is provided in the third branch flow path 104.

There may be a case where the pump 1, the cooler 3, and the radiator 5 are located remotely. In this case, in order to cause heat to be exchanged between the discharge-side heat exchanger 7 and the two-phase region heat exchanger 13, the refrigerant flow path from the cooler 3 to the radiator 5 may become long. The longer the refrigerant flow path from the cooler 3 to the radiator 5, the greater the pressure loss. In particular, a gas-liquid two-phase flow flows through the refrigerant flow path from the cooler 3 to the radiator 5, so that the pressure loss increases significantly.

In the configuration illustrated in FIG. 22, the two-phase region heat exchanger 13 is provided in the third branch flow path 104 that branches from the refrigerant flow path from the cooler 3 to the radiator 5 and joins the refrigerant flow path again. Thus, if the third branch flow path 104 where the two-phase region heat exchanger 13 is provided is lengthened, there is no need to extend the refrigerant flow path from the cooler 3 to the radiator 5. By lengthening the third branch flow path 104 where the two-phase region heat exchanger 13 is provided, the length of the third branch flow path 104 increases, making it difficult for the refrigerant to flow. However, by cooling the two-phase region heat exchanger 13 via the second Peltier device 9b, the gas-phase refrigerant with a high pressure loss is condensed and the proportion of the liquid-phase refrigerant increases, resulting in a smooth flow. As a result, the electric power consumption of the cooling apparatus 100 can be further reduced without increasing the pressure loss of the refrigerant flow path from the cooler 3 to the radiator 5.

Embodiment 5

Embodiment 5 differs from Embodiments 1 to 4 in that the cooling apparatus 100 uses parallel flow paths to cool a plurality of electronic instruments 2 with different appropriate temperature ranges. In Embodiment 5, this difference will be described and description of the same aspects will be omitted.

In Embodiment 5, an example in which the configuration of Embodiment 1 is changed will be described.

*Description of Configurations*

Figure 23:
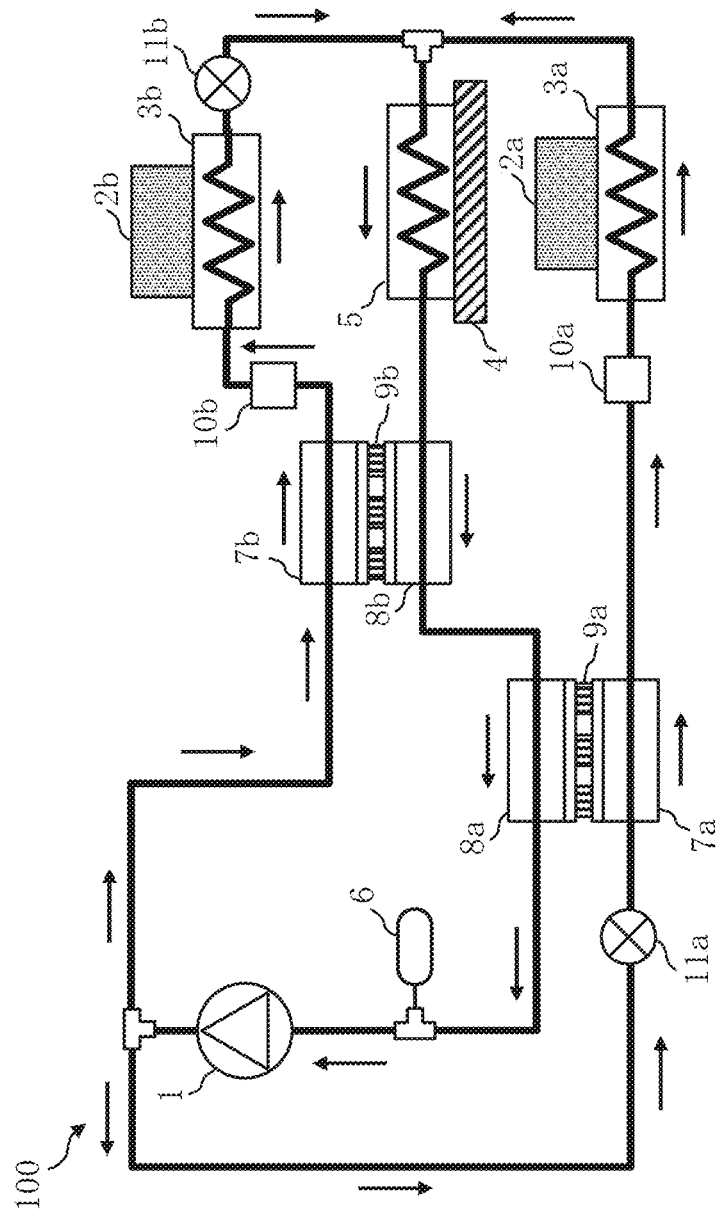
FIG. 23 is a refrigerant circuit diagram of the cooling apparatus 100 according to Embodiment 5.

Referring to FIG. 23, a configuration of the cooling apparatus 100 according to Embodiment 5 will be described.

In FIG. 23, solid arrows indicate the main flow direction of the refrigerant.

It may be considered that a plurality of coolers 3 to respectively cool a plurality of electronic instruments 2 are connected so that the refrigerant flows from an electronic instrument 2 with a higher appropriate temperature range to an electronic instrument 2 with a lower appropriate temperature range sequentially while adjusting the saturated vapor pressure so that the gas-liquid two-phase refrigerant flowing through each of the coolers 3 is at a temperature conforming to the appropriate temperature range. However, when the electronic instruments 2 are placed apart from each other, if the coolers 3 are connected in descending order of the appropriate temperature ranges, the pressure loss of the flow path between the coolers 3 will increase. Therefore, in the cooling apparatus 100 according to Embodiment 5, a plurality of coolers 3 are connected in parallel, and the saturated vapor pressure is adjusted in each flow path so that each electronic instrument 2 is within the appropriate temperature range.

FIG. 23 illustrates an example in which a first electronic instrument 2a with a lower appropriate temperature range and a second electronic instrument 2b with a higher appropriate temperature range are provided.

In FIG. 23, in the cooling apparatus 100, the flow path branches into parallel flow paths after discharge from the pump 1, and a first cooler 3a to cool the first electronic instrument 2a is provided in one of the parallel flow paths and a second cooler 3b to cool the second electronic instrument 2b is provided in the other one of the parallel flow paths. After the two parallel flow paths join together, the refrigerant flows to the radiator 5.

In the parallel flow path including the first cooler 3a, a first flow rate control valve 11a that adjusts the flow rate and pressure of the refrigerant flowing through the first cooler 3a is provided. The first flow rate control valve 11a is provided on the upstream side of the first cooler 3a. This can reduce the pressure of the refrigerant flowing through the first cooler 3a that cools the first electronic instrument 2a with the lower appropriate temperature range. The first discharge-side heat exchanger 7a is provided on the upstream side of the first cooler 3a. A first vapor generation unit 10a is provided between the first discharge-side heat exchanger 7a and the first cooler 3a. The order in which the refrigerant flows through the first flow rate control valve 11a may be either before or after the first discharge-side heat exchanger 7a, or may be after the first vapor generation unit 10a.

In the parallel flow path including the second cooler 3b, a second flow rate control valve 11b that adjusts the flow rate and pressure of the refrigerant flowing through the second cooler 3b is provided. The second flow rate control valve 11b is provided on the downstream side of the second cooler 3b. This can prevent reduction in the pressure of the refrigerant flowing through the second cooler 3b that cools the second electronic instrument 2b with the higher appropriate temperature range. The second discharge-side heat exchanger 7b is provided on the upstream side of the second cooler 3b in the parallel flow path, and a second vapor generation unit 10b is provided between the second discharge-side heat exchanger 7b and the second cooler 3b.

In the flow path from the radiator 5 to the pump 1, the second suction-side heat exchanger 8b and the first suction-side heat exchanger 8a are provided so that the refrigerant flows through them sequentially. The first Peltier device 9a is provided to be sandwiched between the first discharge-side heat exchanger 7a and the first suction-side heat exchanger 8a, and the first discharge-side heat exchanger 7a and the first suction-side heat exchanger 8a are arranged opposite to each other so that they are countercurrent to each other and exchange heat via the first Peltier device 9a. The second Peltier device 9b is provided to be sandwiched between the second discharge-side heat exchanger 7b and the second suction-side heat exchanger 8b, and the second discharge-side heat exchanger 7b and the second suction-side heat exchanger 8b are arranged opposite to each other so that they are countercurrent to each other and exchange heat via the second Peltier device 9b.

*Description of Operation*

The refrigerant that branches after being discharged from the pump 1 and flows through the parallel flow path including the first cooler 3a is depressurized in the first flow rate control valve 11a, so that the saturation vapor temperature is lowered and boiling is facilitated even at a low temperature. The refrigerant depressurized in and flowed out from the first flow rate control valve 11a exchanges heat, so as to be heated, in the first discharge-side heat exchanger 7a via the first Peltier device 9a with the low-temperature refrigerant that has been cooled in the second suction-side heat exchanger 8b and flowed into the first suction-side heat exchanger 8a. The refrigerant heated in and flowed out from the first discharge-side heat exchanger 7a flows into the first cooler 3a in a state containing vapor bubbles generated in the first vapor generation unit 10a, and cools the first electronic instrument 2a with latent heat at a low saturation vapor temperature.

The refrigerant that branches after being discharged from the pump 1 and flows through the parallel flow path including the second cooler 3b flows into the second discharge-side heat exchanger 7b while maintaining high pressure. The refrigerant that has flowed into the second discharge-side heat exchanger 7b exchanges heat, so as to be heated, via the second Peltier device 9b with the refrigerant that has flowed out from the radiator 5 and then flowed into the second suction-side heat exchanger 8b. The refrigerant heated in and flowed out from the second discharge-side heat exchanger 7b flows into the second cooler 3b in a state containing vapor bubbles generated in the second vapor generation unit 10b, and cools the second electronic instrument 2b with latent heat at a high saturation vapor temperature. The high-temperature and high-pressure gas-liquid two-phase refrigerant that has cooled the second electronic instrument 2b is depressurized in the second flow rate control valve 11b to become low-temperature and low-pressure gas-liquid two-phase refrigerant, and joins the refrigerant flowing out from the first cooler 3a and then flows into the radiator 5.

The gas-liquid two-phase refrigerant that has flowed into the radiator 5 releases heat to the radiation surface 4, thereby being cooled and condensing to become mostly supercooled liquid. Then, the supercooled liquid containing remaining bubbles that have failed to condense flows out from the radiator 5, and flows sequentially through the second suction-side heat exchanger 8b and the first suction-side heat exchanger 8a to be further cooled, which causes the bubbles to dissipate, and then flows into the pump 1 again.

*Effects of Embodiment 5*

Even when a plurality of electronic instruments 2 with different appropriate temperature ranges are placed apart from each other, the cooling apparatus 100 according to Embodiment 5 can suppress a boiling delay in each cooler 3 and prevent uneven heating in each of the electronic instruments 2 while reducing a difference in the temperatures of the both end faces of the Peltier device 9 and efficiently performing heat exchange.

The refrigerant flowing through the first discharge-side heat exchanger 7a is at low pressure, so that the temperature at which evaporation starts is low. The refrigerant flowing through the second discharge-side heat exchanger 7b is at high pressure, so that the temperature at which evaporation starts is high. Therefore, in the second discharge-side heat exchanger 7b it is necessary to heat the refrigerant to a higher temperature than in the first discharge-side heat exchanger 7a. Thus, in the second suction-side heat exchanger 8b, the refrigerant relatively close to the saturation vapor temperature that has flowed out from the radiator 5 exchanges heat, so as to be cooled, via the second Peltier device 9b with the refrigerant flowing through the second discharge-side heat exchanger 7b. Then, in the first suction-side heat exchanger 8a, the refrigerant cooled in the second suction-side heat exchanger 8b to a lower temperature exchanges heat via the first Peltier device 9a with the refrigerant flowing through the first discharge-side heat exchanger 7a. This reduces a difference in the temperatures of the both end faces of the first Peltier device 9a and a difference in the temperatures of the both end faces of the second Peltier device 9b.

*Other Configurations*

<Variation 1 of Embodiment 5>

Figure 24:
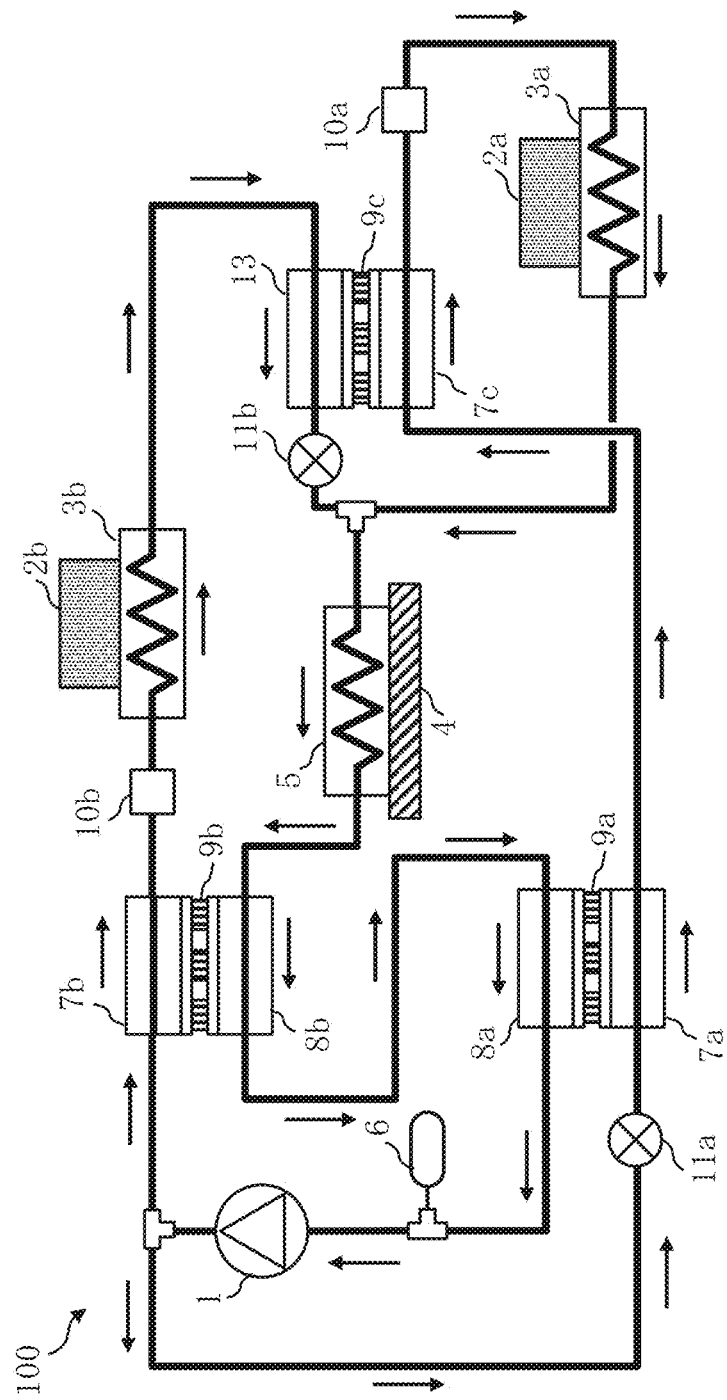
FIG. 24 is a refrigerant circuit diagram of the cooling apparatus 100 according to Variation 1 of Embodiment 5.

As illustrated in FIG. 24, the cooling apparatus 100 may include the two-phase region heat exchanger 13. Specifically, the two-phase region heat exchanger 13 is provided in the flow path from the second cooler 3b to the second flow rate control valve 11b. The third discharge-side heat exchanger 7c is provided in the flow path from the first discharge-side heat exchanger 7a to the first cooler 3a The third Peltier device 9c is provided to be sandwiched between the two-phase region heat exchanger 13 and the third discharge-side heat exchanger 7c, and the two-phase region heat exchanger 13 and the third discharge-side heat exchanger 7c exchange heat via the third Peltier device 9c so that they are countercurrent to each other.

If the pressure loss of the refrigerant in the second cooler 3b is not too high, the temperature of the gas-liquid two-phase refrigerant after flowing out from the second cooler 3b is a high saturation vapor temperature. There may be a case where the temperature of the refrigerant flowing into the two-phase region heat exchanger 13 exceeds the saturation vapor temperature of the refrigerant flowing through the third discharge-side heat exchanger 7c. In this case, it is possible to transmit heat from the two-phase region heat exchanger 13 to the third discharge-side heat exchanger 7c by heat transfer so as to cool the two-phase region heat exchanger 13 and heat the third discharge-side heat exchanger 7c without applying electric power to the third Peltier device 9c.

As described above, the difference in the temperatures of the both end faces of the third Peltier device 9c can be further reduced or the temperatures of the both end faces can be reversed, so that the electric power consumption of the cooling apparatus 100 can be further reduced and uneven cooling of the electric instruments can be prevented.

<Variation 2 of Embodiment 5>

In FIGS. 23 and 24, examples including the first electronic instrument 2a with the lower appropriate temperature range and the second electronic instrument 2b with the higher appropriate temperature range have been described. However, the configurations of Embodiment 5 can also be applied when three or more electronic instruments 2 with different appropriate temperature ranges are placed apart from each other.

In this case, in the parallel flow path including the cooler 3 that cools the electronic instrument 2 with the lowest appropriate temperature range, the flow rate control valve 11 is provided on the upstream side of the cooler 3. In the parallel flow path including the cooler 3 that cools the electronic instrument 2 with the highest appropriate temperature range, the flow rate control valve 11 is provided on the downstream side of the cooler 3. In the parallel flow path including the cooler 3 that cools any other electronic instrument 2, the flow rate control valve 11 is provided on each of the upstream side and the downstream side of the cooler 3. This allows the pressure of the refrigerant flowing through each of the parallel flow paths to be appropriately controlled.

As the appropriate temperature range of the electronic instrument 2 is higher, the discharge-side heat exchanger 7 provided in the parallel flow path including the cooler 3 that cools that electronic instrument may preferably exchange heat via the Peltier device 9 with the suction-side heat exchanger 8 provided on a more upstream side in the flow path after outflow from the radiator 5.

Embodiment 6

Embodiment 6 differs from Embodiments 1 to 5 in that the Peltier device 9 is provided between the radiation surface 4 and the suction-side heat exchanger 8. In Embodiment 6, this difference will be described and description of the same aspects will be omitted.

In Embodiment 6, an example in which the configuration of Embodiment 1 is changed will be described.

*Description of Configurations*

Figure 25:
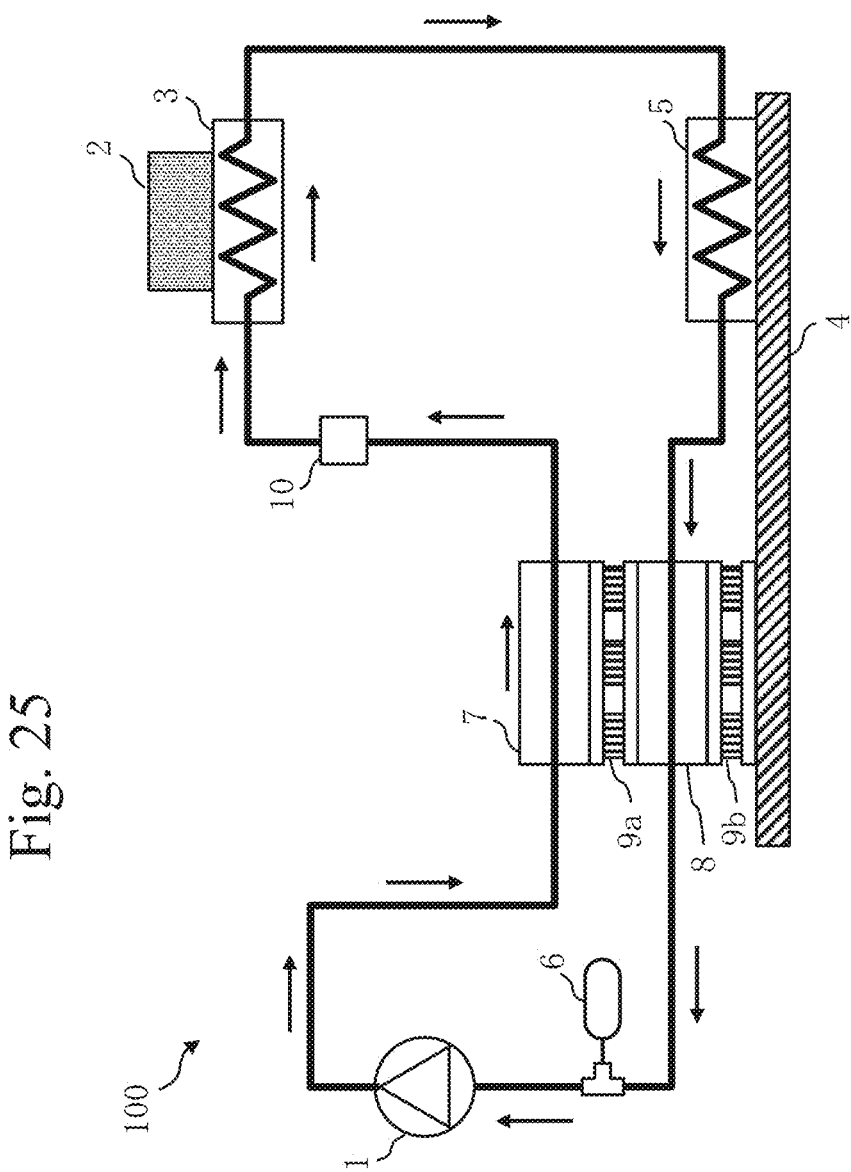
FIG. 25 is a refrigerant circuit diagram of the cooling apparatus 100 according to Embodiment 6.

Referring to FIG. 25, a configuration of the cooling apparatus 100 according to Embodiment 6 will be described.

In FIG. 25, solid arrows indicate the main flow direction of the refrigerant.

As illustrated in FIG. 25, the cooling apparatus 100 according to Embodiment 6 includes the second Peltier device 9b between the radiation surface 4 and the suction-side heat exchanger 8. The refrigerant flowing through the suction-side heat exchanger 8 and the radiation surface 4 exchange heat via the second Peltier device 9b.

*Description of Operation*

When the amount of heat generated in the electronic instrument 2 is high and the radiation surface 4 receives solar radiation, resulting in an insufficient amount of heat radiation, the cooling apparatus 100 applies an electric current to the second Peltier device 9b. This causes heat to be transferred from the refrigerant flowing through the suction-side heat exchanger 8 to the radiation surface 4 so as to further cool the refrigerant flowing through the suction-side heat exchanger 8 and raise the temperature of the radiation surface 4.

When the amount of heat generated in the electronic instrument 2 is low and the radiation surface 4 does not receive solar radiation, resulting in an excessive amount of heat radiation, the cooling apparatus 100 applies a reverse electric current to the second Peltier device 9b. This causes heat to be transferred from the radiation surface 4 to the refrigerant flowing though the suction-side heat exchanger 8 so as to heat the refrigerant flowing through the suction-side heat exchanger 8 and lower the temperature of the radiation surface 4.

*Effects of Embodiment 6*

When the amount of heat generated in the electronic instrument 2 is high and the radiation surface 4 receives solar radiation, resulting in an insufficient amount of heat radiation, the cooling apparatus 100 according to Embodiment 6 uses the second Peltier device 9b to further cool the refrigerant flowing through the suction-side heat exchanger 8 and increase the temperature of the radiation surface 4. As a result, bubbles flowing into the pump 1 can be further suppressed, and the amount of heat radiated into deep space on the radiation surface 4 can be increased to compensate for insufficient cooling in the radiator 5.

When the amount of heat generated in the electronic instrument 2 is low and the radiation surface 4 does not receive solar radiation, resulting in an excessive amount of heat radiation, the cooling apparatus 100 according to Embodiment 6 applies a reverse electric current to the second Peltier device 9b. As a result, the refrigerant flowing through the suction-side heat exchanger 8 can be heated to prevent the temperature of the refrigerant flowing into the pump 1 from falling below the minimum allowable temperature of the pump 1, and the amount of heat radiated into deep space on the radiation surface 4 can be reduced as a result of lowering of the temperature of the radiation surface 4. Since the release of thermal energy into deep space is suppressed, the electric power consumption of the first Peltier device 9a and the vapor generation unit 10 can be reduced.

*Other Configurations*

<Variation 1 of Embodiment 6>

Figure 26:
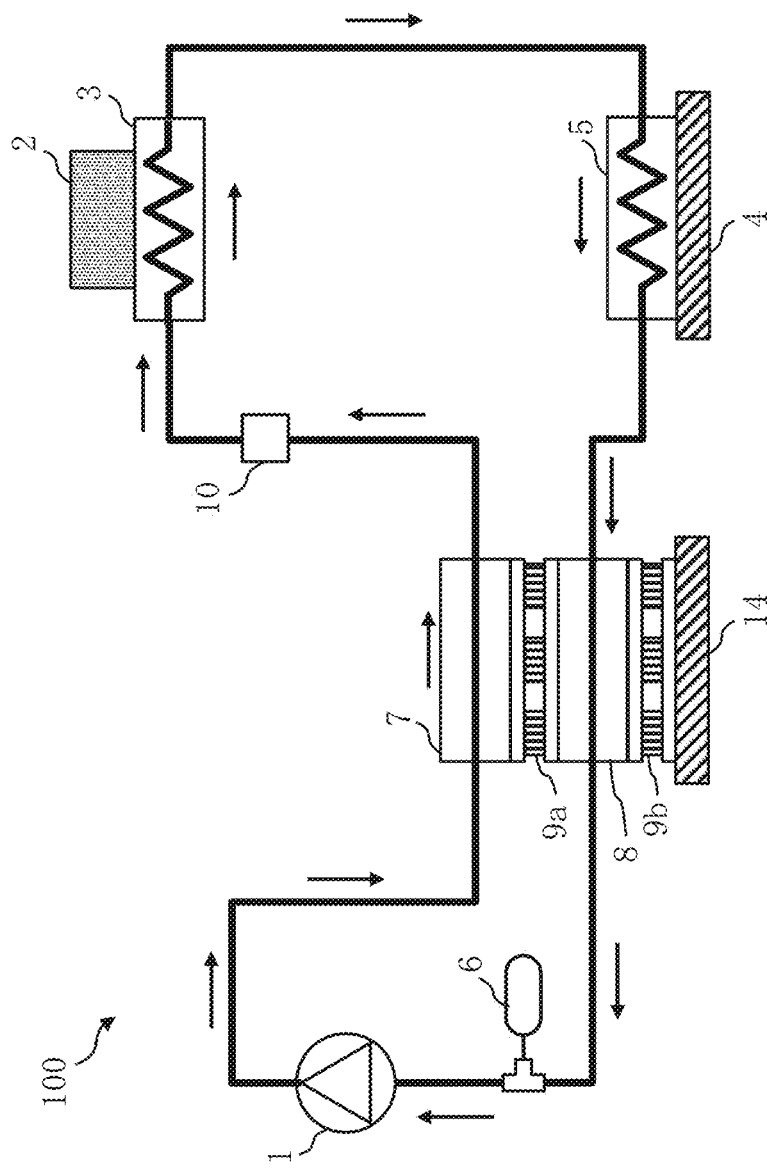
FIG. 26 is a refrigerant circuit diagram of the cooling apparatus 100 according to Variation 1 of Embodiment 6.

As illustrated in FIG. 26, the artificial satellite 200 may include a sub radiation surface 14 that is adiabatically divided from the radiation surface 4. In this case, the second Peltier device 9b is provided between the sub radiation surface 14, instead of the radiation surface 4, and the suction-side heat exchanger 8, and heat is exchanged via the second Peltier device 9b between the refrigerant flowing through the suction-side heat exchanger 8 and the sub radiation surface 14.

The radiation surface 4 that exchanges heat with the radiator 5 and the sub radiation surface 14 that exchanges heat with the suction-side heat exchanger 8 via the second Peltier device 9b are adiabatically divided. Therefore, heat exchange between the radiation surface 4 and the sub radiation surface 14 is suppressed, and the temperatures of the radiation surface 4 and the sub radiation surface 14 can be made different to adjust the amount of heat radiation. When the amount of heat generated in the electronic instrument 2 is high and the radiation surface 4 receives solar radiation, resulting in an insufficient amount of heat radiation, the temperature of the sub radiation surface 14 can be further raised to increase the amount of heat radiation. When the amount of heat generated in the electronic instrument 2 is low and the radiation surface 4 does not receive solar radiation, resulting in an excessive amount of heat radiation, the temperature of the sub radiation surface 14 can be further lowered to reduce the amount of heat radiation.

<Variation 2 of Embodiment 6>

Figure 27:
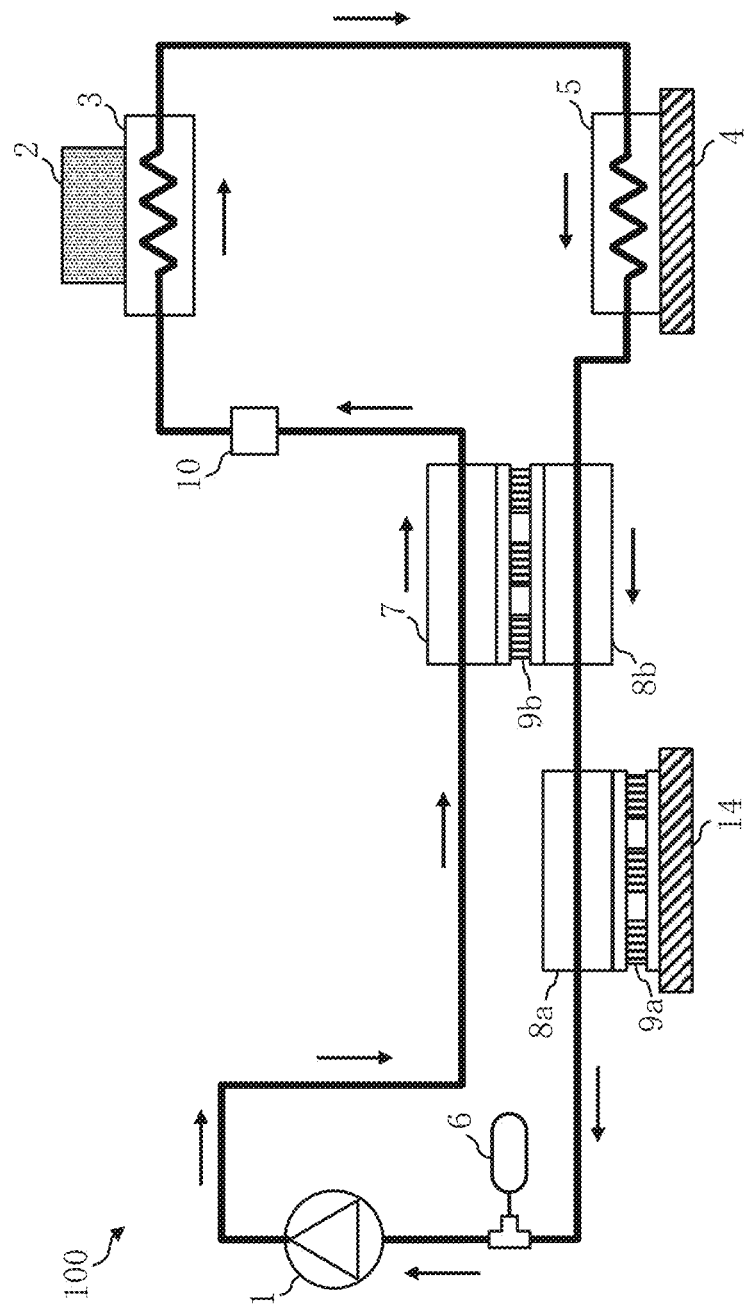
FIG. 27 is a refrigerant circuit diagram of the cooling apparatus 100 according to Variation 2 of Embodiment 6.
Figure 28:
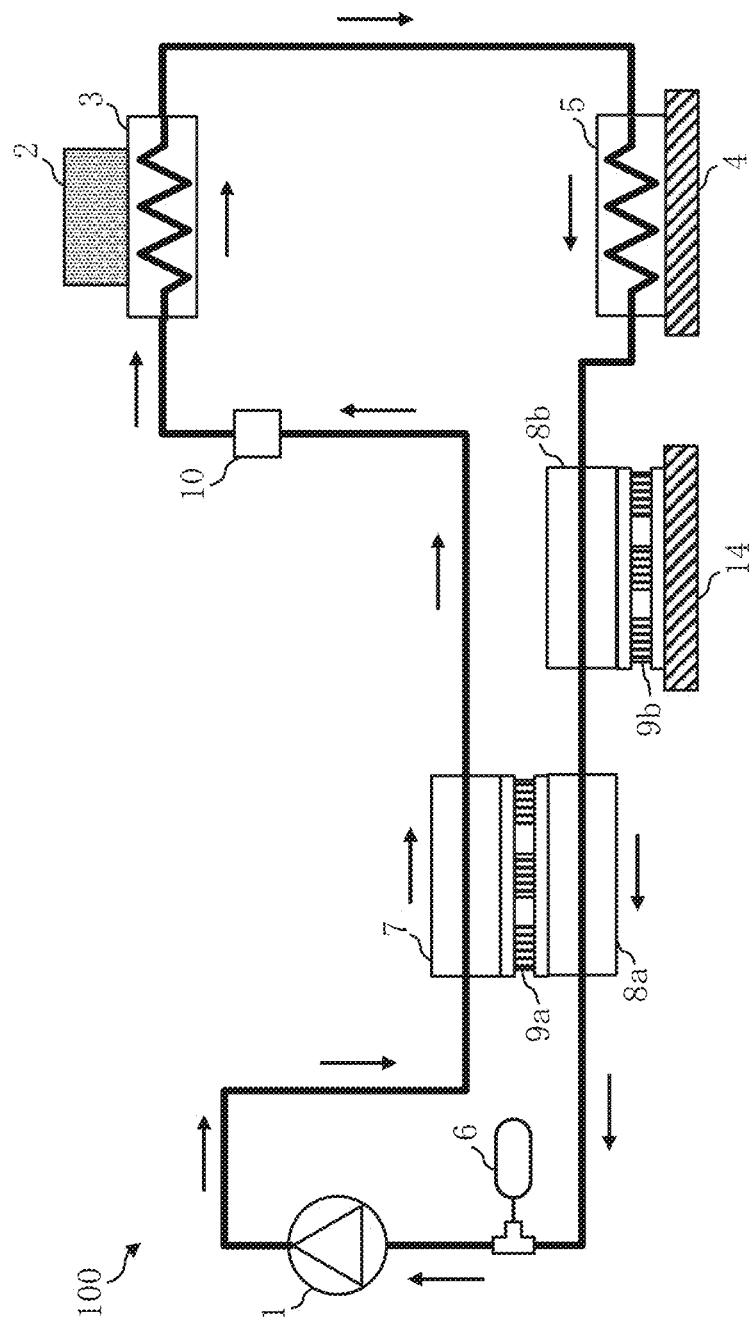
FIG. 28 is a refrigerant circuit diagram of the cooling apparatus 100 according to Variation 2 of Embodiment 6.

As illustrated in FIGS. 27 and 28, the cooling apparatus 100 may include a plurality of suction-side heat exchangers 8 so that the refrigerant flows through them sequentially, and at least one of the suction-side heat exchangers 8 may exchange heat via the Peltier device 9 with the discharge-side heat exchanger 7 and the rest of the suction-side heat exchangers 8 may exchange heat via the Peltier device 9 with the radiation surface 4 or the sub radiation surface 14.

In the configurations illustrated in FIGS. 27 and 28, the cooling apparatus 100 includes the suction-side heat exchangers 8, namely the first suction-side heat exchanger 8a and the second suction-side heat exchanger 8b. The refrigerant flowing out from the radiator 5 flows sequentially through the second suction-side heat exchanger 8b, the first suction-side heat exchanger 8a, and the pump 1.

In FIG. 27, the first Peltier device 9a is provided between the first suction-side heat exchanger 8a and the sub radiation surface 14, and heat is exchanged via the first Peltier device 9a between the refrigerant flowing through the first suction-side heat exchanger 8a and the sub radiation surface 14. The second Peltier device 9b is provided between the second suction-side heat exchanger 8b and the discharge-side heat exchanger 7, and heat is exchanged via the second Peltier device 9b between the refrigerant flowing through the discharge-side heat exchanger 7 and the refrigerant flowing through the second suction-side heat exchanger 8b.

In this configuration, when the amount of heat generated in the electronic instrument 2 is low and the radiation surface 4 does not receive solar radiation, resulting in an excessive amount of heat radiation, the refrigerant is cooled in the second suction-side heat exchanger 8b when heat is transferred from the second suction-side heat exchanger 8b to the discharge-side heat exchanger 7 by the second Peltier device 9b so as to heat the refrigerant flowing through the discharge-side heat exchanger 7. Then, by transferring heat from the sub radiation surface 14 to the first suction-side heat exchanger 8a by the first Peltier device 9a, the cooled refrigerant can be heated again in the first suction-side heat exchanger 8a.

That is, cooling the refrigerant flowing out from the radiator 5 in the second suction-side heat exchanger 8b causes remaining bubbles to condense. However, the refrigerant whose temperature has been lowered excessively is heated again in the first suction-side heat exchanger 8a. As a result, inflow of bubbles into the pump 1 can be suppressed, and inflow of the refrigerant below the minimum allowable temperature can also be prevented. Furthermore, since the temperature of the sub radiation surface 14 decreases, the amount of heat radiated into deep space is suppressed. Thus, the electric power consumption of the first Peltier device 9a and the vapor generation unit 10 for heating the refrigerant can be reduced.

In FIG. 28, the second Peltier device 9b is provided to be sandwiched between the second suction-side heat exchanger 8b and the sub radiation surface 14, and heat is exchanged via the second Peltier device 9b between the refrigerant flowing through the second suction-side heat exchanger 8b and the sub radiation surface 14. The first Peltier device 9a is provided to be sandwiched between the first suction-side heat exchanger 8a and the discharge-side heat exchanger 7, and heat is exchanged via the first Peltier device 9a between the refrigerant flowing through the discharge-side heat exchanger 7 and the refrigerant flowing through the first suction-side heat exchanger 8a.

In this configuration, when the amount of heat generated in the electronic instrument 2 is high and the radiation surface 4 receives solar radiation, resulting in an insufficient amount of heat radiation, the refrigerant at a relatively high temperature after flowing out from the radiator 5 is cooled in the second suction-side heat exchanger 8b by heat transfer from the second suction-side heat exchanger 8b to the sub radiation surface 14 by the second Peltier device 9b. Therefore, the temperature of the sub radiation surface 14, which is a heat transfer destination, can be further raised to increase the amount of heat radiated into deep space. In addition, even if bubbles remaining in the refrigerant liquid cannot be completely condensed in the second suction-side heat exchanger 8b, the refrigerant liquid is cooled in the first suction-side heat exchanger 8a by heat transfer from the first suction-side heat exchanger 8a to the discharge-side heat exchanger 7 by the first Peltier device 9a, so that the remaining bubbles can be condensed.

As described above, by providing the suction-side heat exchangers 8 so that the refrigerant sequentially flows through them, heat transfer between the suction-side heat exchangers 8 can be suppressed and the temperatures of the suction-side heat exchangers 8 can be individually adjusted. As a result, the difference in the temperatures of the both end faces of the Peltier device 9 provided at each of the suction-side heat exchangers 8 can be reduced. As a result, heat can be exchanged efficiently, and the electric power consumption of each Peltier device 9 can be further reduced.

Embodiment 7

Embodiment 7 differs from Embodiment 1 in that the radiation surface of the artificial satellite 200 is divided into a south-side radiation surface 4a and a north-side radiation surface 4b. In Embodiment 7, this difference will be described and description of the same aspects will be omitted.

In Embodiment 7, an example in which the configuration of Embodiment 1 is changed will be described.

\*\*\*Description of Configurations\*\*\*

Figure 29:
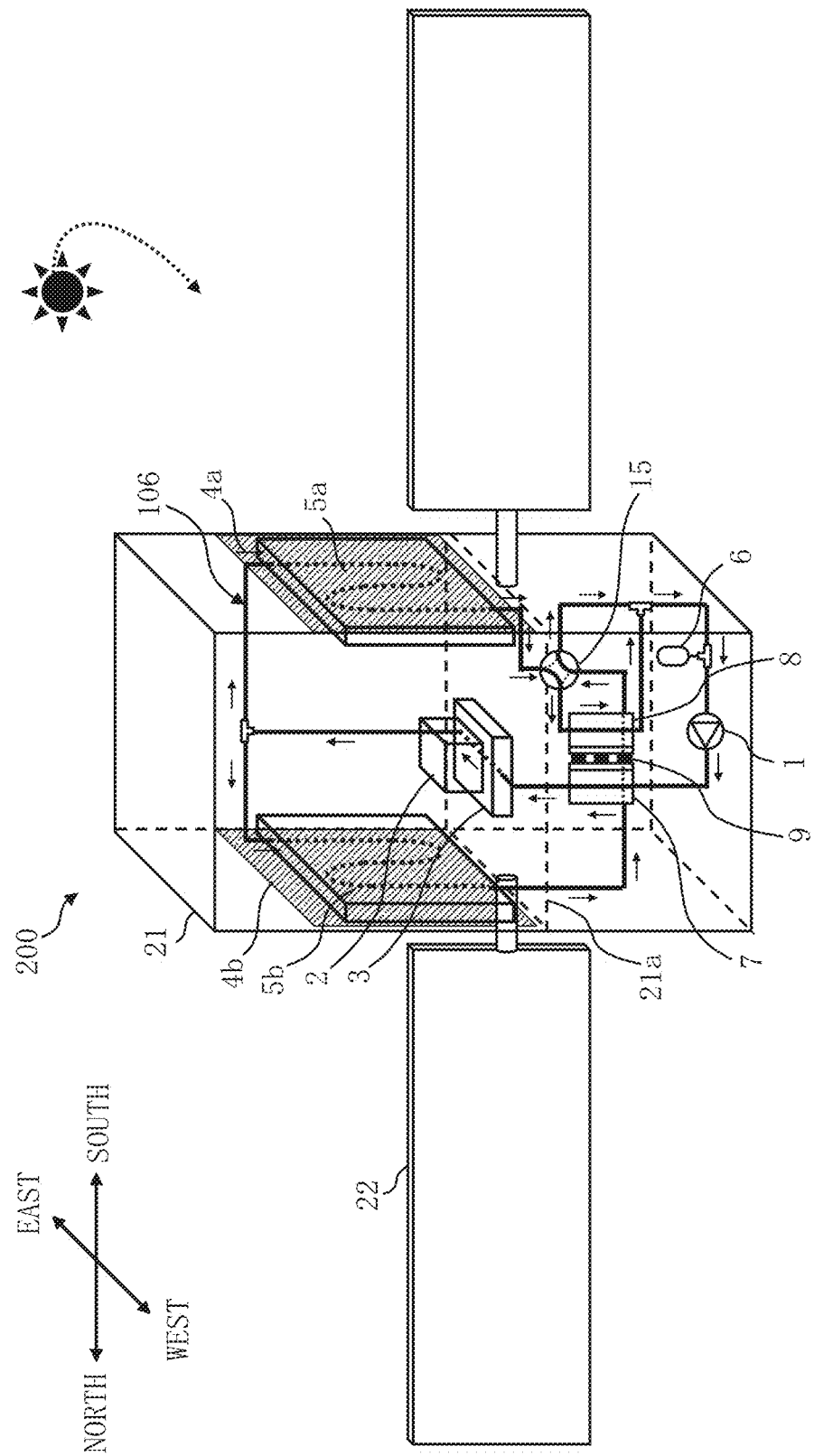
FIG. 29 is an outline configuration diagram of the artificial satellite 200 including the cooling apparatus 100 according to Embodiment 7.
Figure 30:
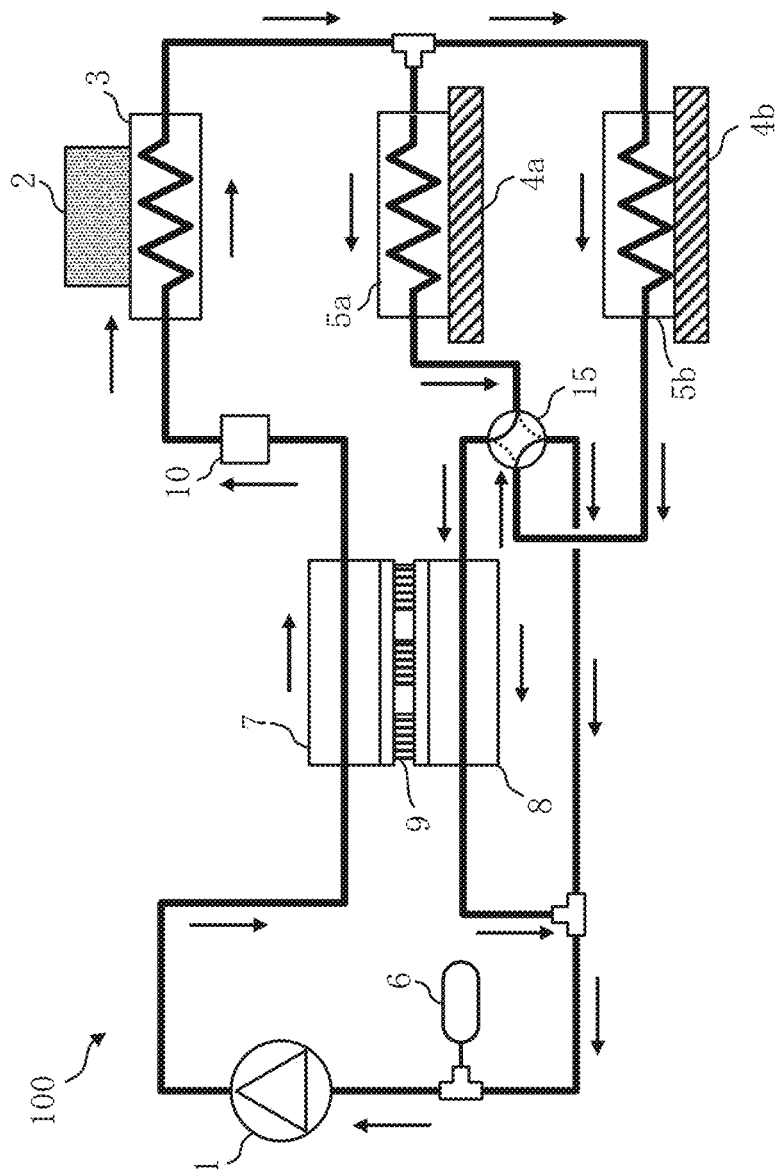
FIG. 30 is a refrigerant circuit diagram of the cooling apparatus 100 according to Embodiment 7.

Referring to FIGS. 29 and 30, a configuration of the cooling apparatus 100 according to Embodiment 7 will be described.

In FIGS. 29 and 30, solid arrows indicate the main flow direction of the refrigerant.

When a space structure receives solar radiation from the sun or the like, the heat radiation capacity of a surface receiving the solar radiation is greatly reduced compared with a shaded surface. Satellites orbiting the earth often have fixed attitudes so that the surfaces in the north, south, east, and west directions with respect to the earth are unchanged, and the solar radiation load changes under the influence of the rotation movement of the earth per day on the east and west surfaces and the influence of the revolution movement of the earth per year on the north and south surfaces.

In the artificial satellite 200 according to Embodiment 7, the south-side radiation surface 4a is provided on a south-side outer surface and the north-side radiation surface 4b is provided on a north-side outer surface of the main body 21.

The cooling apparatus 100 provided in the main body 21 is configured so that the refrigerant flowing out from the cooler 3 is divided to flow in parallel into a south-side radiator 5a that exchanges heat with the south-side radiation surface 4a and a north-side radiator 5b that exchanges heat with the north-side radiation surface 4b. The refrigerant flowing out from the south-side radiator 5a and the refrigerant flowing out from the north-side radiator 5b flow into a flow path switch 15. Then, the refrigerant flowing out from the radiator that exchanges heat with a radiation surface with a greater solar radiation load, out of the south-side radiation surface 4a and the north-side radiation surface 4b, flows through the flow path including the suction-side heat exchanger 8, joins the other refrigerant that has flowed through a bypass flow path, and then flows into the pump 1.

The flow path switch 15 is composed of a four-way valve, a device that is a combination of on-off valves, or the like.

In FIGS. 29 and 30, an example about the radiation surfaces 4 installed on the north and south surfaces of the main body 21 is presented. However, radiation surfaces may be installed not only on the north and south surfaces but also on the east and west surfaces and so on.

\*\*\*Description of Operation\*\*\*

The refrigerant that has cooled the electronic instrument 2 and received heat in the cooler 3 branches to flow into the south-side radiator 5a and the north-side radiator 5b. The heat radiation capacity decreases on a surface that receives stronger solar radiation out of the south-side radiation surface 4a and the north-side radiation surface 4b. Therefore, in the radiator 5 that exchanges heat with that surface, the amount of condensation of gas-phase refrigerant is insufficient, resulting in a low degree of supercooling. On the other hand, the radiation surface 4 that receives weaker solar radiation maintains sufficiently high heat radiation capacity, resulting in a sufficiently high degree of supercooling in the refrigerant flowing out from the radiator 5 that exchanges heat with that radiation surface 4.

The flow path of the refrigerant flowing out from the radiator 5 that exchanges heat with the radiation surface 4 that receives stronger solar radiation is switched by the flow path switch 15 so as to flow into the suction-side heat exchanger 8. The suction-side heat exchanger 8 exchanges heat with the discharge-side heat exchanger 7 via the Peltier device 9, and the refrigerant flowing through the discharge-side heat exchanger 7 is heated to around the saturation vapor temperature and the refrigerant flowing through the suction-side heat exchanger 8 is cooled to a sufficient degree of supercooling and remaining bubbles dissipate. The refrigerant flowing out from the suction-side heat exchanger 8 joins the low-temperature refrigerant flowing out from the radiator 5 that exchanges heat with the radiation surface 4 that receives weaker solar radiation and flows into the pump 1. The dissipation of the remaining bubbles is also facilitated by agitation in the flow at the joint point.

*Effects of Embodiment 7*

Even with a plurality of radiation surfaces 4 where the loads may change constantly and there may be a difference or reversal in the radiation capacities, the cooling apparatus 100 according to Embodiment 7 can compensate for insufficient cooling in the radiator 5 with a higher load by exchanging heat via the Peltier device 9 between the refrigerant flowing through the suction-side heat exchanger 8 and the refrigerant flowing through the discharge-side heat exchanger 7.

The temperature of the refrigerant flowing out from the radiator 5 with the higher load and then flowing into the suction-side heat exchanger 8 as a result of switching of the flow path by the flow path switch 15 is close to the saturation vapor temperature. Therefore, it is easy to heat the refrigerant to around the saturation vapor temperature in the discharge-side heat exchanger 7, so that the difference in the temperatures of the both end faces of the Peltier device 9 is reduced and the electric power consumption can also be reduced.

In the artificial satellite 200, the outer surfaces of the main body 21 where the radiation surfaces 4 can be installed increase. Therefore, the total radiation area of all the radiation surfaces 4 increases, and even when the electronic instrument 2 with a higher heat generation amount is installed, the cooling apparatus 100 can cool the electronic instrument 2 with high radiation capacity.

*Other Configurations*

<Variation 1 of Embodiment 7>

In FIGS. 29 and 30, an example about the radiation surfaces 4 placed on the north and south surfaces of the main body 21 is presented. However, the radiation surfaces 4 may be placed on not only the north and south surfaces but also the east and west surfaces or the like. In this case, it is arranged that the flow path is switched so that the refrigerant flowing out from the radiator 5 that exchanges heat with the radiation surface 4 that receives stronger solar radiation flows into the suction-side heat exchanger 8.

This further increases the outer surfaces of the main body 21 where the radiation surfaces 4 can be placed. Therefore, the total radiation area of all the radiation surfaces 4 increases, and even when the electronic instrument 2 with a higher heat generation amount is installed, the cooling apparatus 100 can cool the electronic instrument 2 with high radiation capacity.

Embodiment 8

In Embodiment 8, a case w % here the cooling apparatus 100 is installed in an installation apparatus other than the artificial satellite 200 will be described.

In Embodiments 1 to 7, the cases where the cooling apparatus 100 is installed in the artificial satellite 200 have been described. However, the installation apparatus is not limited to the artificial satellite 200, and the cooling apparatus 100 may be installed in other installation apparatuses. Specifically, it may be installed in space structures other than an artificial satellite, such as a probe and a spacecraft, or may be installed in a ground facility.

For example, by replacing the radiation surface 4 with a radiator fin in contact with a low temperature fluid of various types such as air and water, the electronic instrument 2 can be cooled with low electric power consumption and high radiation capacity in a ground facility.

The cooling apparatus 100 can be used regardless of the direction of gravity. Therefore, it can be installed in a ground facility in various attitudes, and a change in attitude during use will not cause a failure, allowing use with long service life. For example, it operates properly in and can thus be applied to a moving apparatus subject to inertial force other than gravity, such as an automobile, an airplane, a railroad car, and an elevator.

For example, it is conceivable that an automobile driven by an engine is used as an installation apparatus. In this case, instead of the electronic instrument 2, a heat-generating instrument such as an internal-combustion engine of the automobile driven by the engine can be used as the object to be cooled. The pump 1 may be attached to a rotary drive unit driven by power from the engine or electric power device of the automobile so as to circulate a refrigerant.

The embodiments and variations of the present disclosure have been described above. Two or more of these embodiments and variations may be implemented in combination. Alternatively, one or more of these embodiments and variations may be implemented partially. The present disclosure is not limited to the above embodiments and variations, and various modifications can be made as required.

REFERENCE SIGNS LIST

1: pump, 2: electronic instrument, 2a: first electronic instrument, 2b: second electronic instrument, 3: cooler, 3a: first cooler, 3b: second cooler, 4: radiation surface, 4a: south-side radiation surface, 4b: north-side radiation surface, 5: radiator, 5a: south-side radiator, 5b: north-side radiator, 6: accumulator, 7: discharge-side heat exchanger, 7a: first discharge-side heat exchanger, 7b: second discharge-side heat exchanger. 7c: third discharge-side heat exchanger, 8: suction-side heat exchanger, 8a: first suction-side heat exchanger, 8b: second suction-side heat exchanger, 8c: third suction-side heat exchanger, 9: Peltier device, 9a: first Peltier device, 9b: second Peltier device. 9c: third Peltier device, 10: vapor generation unit, 10a first vapor generation unit, 10b: second vapor generation unit, 11: flow rate control valve, 11a: first flow rate control valve, 11b: second flow rate control valve, 12: gas-liquid separator, 12a: gas-liquid two-phase inflow unit, 12b: separation unit, 12c: liquid-phase outflow unit, 12d: gas-phase outflow unit, 13: two-phase region heat exchanger, 14: sub radiation surface. 15: flow path switch, 100: cooling apparatus, 101: bypass branched flow path, 102: first branch flow path, 103: second branch flow path. 104: third branch flow path.

The invention claimed is:

1. A cooling apparatus to cool a heat-generating instrument installed in an installation apparatus, the cooling apparatus comprising:
   a pump for circulating refrigerant in a liquid state;
   a cooler for cooling the heat-generating instrument with the refrigerant;
   a radiator for cooling the refrigerant;
   a refrigerant flow path that is configured circularly by sequentially connecting the pump, the cooler and the radiator;

a discharge-side heat exchanger that is provided in the refrigerant flow path between the pump and the cooler;

a suction-side heat exchanger provided in the refrigerant flow path between the radiator and the pump; and a Peltier device provided between the discharge-side heat exchanger and the suction-side heat exchanger, the Peltier device being for transferring heat from the refrigerant flowing through the suction-side heat exchanger to the refrigerant flowing through the discharge-side heat exchanger.

2. The cooling apparatus according to claim 1,
wherein the discharge-side heat exchanger and the suction-side heat exchanger are placed to transfer heat from the refrigerant flowing through a downstream side of the suction-side heat exchanger to the refrigerant flowing through an upstream side of the discharge-side heat exchanger, and transfer heat from the refrigerant flowing through an upstream side in the suction-side heat exchanger to the refrigerant flowing through a downstream side in the discharge-side heat exchanger, the refrigerant enters the suction-side heat exchanger at the upstream side of the suction-side heat exchanger, the refrigerant exits the suction-side heat exchanger at the downstream side of the suction-side heat exchanger, the refrigerant enters the discharge-side heat exchanger at the upstream stream side of the discharge-side heat exchanger, and the refrigerant exists the discharge-side heat exchanger at the downstream side of the discharge-side heat exchanger.

3. The cooling apparatus according to claim 1, wherein the radiator is to be provided inside a radiation surface or in contact with the radiation surface, and the heat-generating instrument operates to the radiation surface to release heat outside of the installation apparatus.

4. The cooling apparatus according to claim 1, further comprising a vapor generation unit provided in the refrigerant flow path from an outflow of the refrigerant from the discharge-side heat exchanger to an inflow of the refrigerant into the cooler.

5. The cooling apparatus according to claim 1, further comprising an accumulator branched from the refrigerant flow path from an outflow of the radiator to the pump.

6. The cooling apparatus according to claim 1, wherein the radiator is disposed on the refrigerant flow path directly upstream of the cooler.

7. The cooling apparatus according to claim 2,
wherein the cooling apparatus comprises a plurality of the Peltier devices, and
wherein the plurality of the Peltier devices are aligned along a direction in which the refrigerant flows.

8. The cooling apparatus according to claim 2,
wherein the cooling apparatus comprises a plurality of sets of the discharge-side heat exchanger, the suction-side heat exchanger, and the Peltier device, and
wherein for each set, the discharge-side heat exchanger is located on a more upstream side in the refrigerant flow path than the respective suction-side heat exchanger and is paired with the respective suction-side heat exchanger, and
for each set, the Peltier device is sandwiched between the discharge-side heat exchanger and the suction-side heat exchanger.

9. The cooling apparatus according to claim 4, wherein the vapor generation unit is configured to generate vapor bubbles in the refrigerant liquid that has flowed out from the discharge-side heat exchanger so as to promote ebullient cooling in the cooler.

10. The cooling apparatus according to claim 5, wherein the accumulator is branched from the refrigerant flow path between the pump and the suction-side heat exchanger.

* * * * *